United States Patent
Beatson et al.

(10) Patent No.: US 7,523,848 B2
(45) Date of Patent: Apr. 28, 2009

(54) METHOD AND APPARATUS FOR MEASURING THE SIZE OF FREE AIR BALLS ON A WIRE BONDER

(75) Inventors: David T. Beatson, Kennett Square, PA (US); Deepak Sood, New Britain, PA (US); Norman Lucas, Collegeville, PA (US); Zhijie Wang, Chalfont, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 679 days.

(21) Appl. No.: 11/148,540

(22) Filed: Jun. 9, 2005

(65) Prior Publication Data

US 2005/0284914 A1 Dec. 29, 2005

Related U.S. Application Data

(60) Continuation-in-part of application No. 10/458,535, filed on Jun. 10, 2003, now Pat. No. 6,997,368, which is a division of application No. 10/131,873, filed on Apr. 25, 2002, now Pat. No. 6,729,530, which is a continuation-in-part of application No. 09/912,024, filed on Jul. 24, 2001, now Pat. No. 6,412,683.

(60) Provisional application No. 60/581,575, filed on Jun. 21, 2004.

(51) Int. Cl.
*B23K 31/02* (2006.01)
*G01B 11/00* (2006.01)

(52) U.S. Cl. ............ 228/4.5; 228/180.5; 228/102; 228/9; 228/104; 356/127; 353/81; 359/431

(58) Field of Classification Search ............ 228/180.5, 228/102, 4.5, 9, 104; 359/431; 353/81; 356/127
See application file for complete search history.

(56) References Cited

U.S. PATENT DOCUMENTS

| 3,072,011 | A | 1/1963 | Hemstreet et al. |
| 3,485,547 | A | 12/1969 | Bougon et al. |
| 3,601,490 | A | 8/1971 | Erickson |
| 3,853,398 | A | 12/1974 | Kano |
| 3,853,404 | A | 12/1974 | Barrett |

(Continued)

FOREIGN PATENT DOCUMENTS

EP 0462596 A 12/1991

(Continued)

*Primary Examiner*—Kiley Stoner
*Assistant Examiner*—Erin B Saad
(74) *Attorney, Agent, or Firm*—Christopher M. Spletzer, Sr.

(57) ABSTRACT

A system for measuring the size of free air balls for use with a wire bonder having a wire bonding tool and an Electric Flame Off (EFO) device is provided. The system includes an imager disposed above a first image plane, a prism disposed below the imager, and at least one lens positioned between the first image plane and the prism in a first optical path. The at least one lens is positioned between the prism and the imager in a second optical path, where the second optical path is different from the first optical path. An image of the free air ball disposed at a lower portion of the wire bonding tool is provided to the imager via the prism and the at least one lens.

7 Claims, 23 Drawing Sheets

U.S. PATENT DOCUMENTS

| | | |
|---|---|---|
| 3,865,467 A | 2/1975 | Von Thuna |
| 3,940,608 A | 2/1976 | Kissinger et al. |
| 3,999,854 A | 12/1976 | Barrett |
| 4,005,937 A | 2/1977 | Barrett |
| 4,325,638 A | 4/1982 | Takeda et al. |
| 4,439,010 A | 3/1984 | Doty |
| 4,452,506 A | 6/1984 | Reeve et al. |
| 5,133,603 A | 7/1992 | Ina et al. |
| 5,177,348 A | 1/1993 | Laor |
| 5,396,334 A * | 3/1995 | Sugawara ................... 356/394 |
| 5,408,189 A | 4/1995 | Swart et al. |
| 5,566,876 A * | 10/1996 | Nishimaki et al. .......... 228/102 |
| 5,566,877 A | 10/1996 | McCormack |
| 5,581,632 A | 12/1996 | Koljonen et al. |
| 5,640,199 A | 6/1997 | Garakani et al. |
| 5,702,049 A | 12/1997 | Biggs et al. |
| 5,760,905 A | 6/1998 | Sasagawa |
| 5,861,909 A | 1/1999 | Garakani et al. |
| 5,938,105 A * | 8/1999 | Singh ...................... 228/180.5 |
| 5,991,436 A | 11/1999 | Koljonen et al. |
| 6,118,540 A | 9/2000 | Roy et al. |
| 6,144,452 A | 11/2000 | Hachiya |
| 6,341,014 B1 | 1/2002 | Maurel et al. |
| 6,412,683 B1 | 7/2002 | Hoffman et al. |
| 6,470,114 B1 | 10/2002 | Kloth |
| 6,556,285 B1 | 4/2003 | Dickson |
| 6,857,554 B2 * | 2/2005 | Hess et al. .................. 228/103 |
| 2001/0011669 A1 * | 8/2001 | Hayata et al. ............... 228/103 |
| 2003/0178469 A1 * | 9/2003 | Hess et al. .................. 228/103 |

FOREIGN PATENT DOCUMENTS

WO 9722237 A 6/1997

\* cited by examiner

METHOD AND APPARATUS FOR MEASURING THE SIZE OF FREE AIR BALLS ON A WIRE BONDER

This application claims the benefit of priority to U.S. Provisional Patent Application No. 60/581,575, filed on Jun. 21, 2004, the contents of which are incorporated in this application by reference. This application is a continuation-in-part of U.S. patent application Ser. No. 10/458,535, filed on Jun. 10, 2003 now U.S. Pat. No. 6,997,368 which is a divisional of U.S. patent application Ser. No. 10/131,873, filed on Apr. 25, 2002, issued as U.S. Pat. No. 6,729,530 on May 4, 2004, which is a continuation-in-part of U.S. patent application Ser. No. 09/912,024 filed on Jul. 24, 2001, issued as U.S. Pat. No. 6,412,683 on Jul. 2, 2002.

FIELD OF THE INVENTION

The invention relates generally to a method and apparatus for measuring the size of free air balls on a wire bonder. More specifically, the present invention relates to the use of a prism such as a cornercube prism to produce the image of a capillary tip with a free air ball present. The present invention is used in conjunction with a machine vision system to analyze the image and measure the diameter of the ball prior to bonding.

BACKGROUND OF THE INVENTION

The fabrication of electronic assemblies, such as integrated circuit chips, typically involves inspection of the device at various phases of the fabrication process. Such inspection procedures often utilize vision systems or image processing systems (e.g., systems that capture images, digitize them and use a computer to perform image analysis) to guide the fabrication machine for correct placement and/or alignment of components.

In fabricating such electronic assemblies, wire bonding is typically used to interconnect the integrated circuit chip with a lead frame. Other well-known interconnect processes include, for example, ball-bumping and stud-bumping. As part of these bonding processes a bonding ball is formed at the end of the bonding wire using a well-known electric flame-off (EFO) technique. The size (diameter) of the bonding ball (free air ball) depends on the current and duration of the EFO. As wire bonders are used for packaging finer and finer pitch devices, it would be desirable to measure and control free air ball diameters in an effort to regulate ball size for ultra fine pitch application.

A conventional vision system (shown in FIG. 11) consists of two image devices, a first image device 1104 placed below workpiece plane 1112 and upwardly viewing objects and a second image device 1102 placed above workpiece plane 1112 and downwardly viewing objects. These conventional systems have drawbacks in that in addition to requiring more than one image device, they are unable to easily compensate for variations in the system due to thermal changes, for example.

Further, in conventional systems, bonding ball diameter is typically measured off-line. That is, the bonding process is interrupted so that the ball diameter or the resultant stud (in the case of stud-bumping) can be measured. Changes in the size of the bonding ball are then made to the EFO system, again off-line, to correct for the size of the bonding ball. Thus, the bonding ball size is measured and adjusted via an off-line calibration sequence and programmed into the wire bonder.

These conventional systems have deficiencies, however, in that they have no way of determining the effect of these settings without again going to an off-line measurement. Thus, the ball size determination and control is open loop and requires interrupting the bonding process, negatively impacting device throughput.

Accordingly, it would be desirable to provide a system and method for allowing a wire bonder to periodically measure the ball diameter so that the EFO system may be controlled to produce the desired size ball continuously without the necessity to interrupt the ball bonding process with off-line measurements and adjustments.

SUMMARY OF THE INVENTION

According to an exemplary embodiment of the present invention, a system for measuring the size of free air balls for use with a wire bonder having a wire bonding tool and an Electric Flame Off (EFO) device is provided. The system includes an imager disposed above a first image plane, a prism disposed below the imager, and at least one lens positioned between the first image plane and the prism in a first optical path. The at least one lens is positioned between the prism and the imager in a second optical path, where the second optical path is different from the first optical path. An image of the free air ball disposed at a lower portion of the wire bonding tool is provided to the imager via the prism and the at least one lens.

According to another exemplary embodiment of the present invention, a method for measuring a size of a free air ball for use with a wire bonder having a wire bonding tool and an Electric Flame Off (EFO) device is provided. The method includes receiving an indirect image of the free air ball via a prism, processing the received image of the free air ball to measure at least one dimension of the free air ball, and providing a control signal to the EFO device based on the at least one dimension of the free air ball.

According to yet another exemplary embodiment of the present invention, a method for analyzing an image of a free air ball for use with a wire bonder having an Electric Flame Off (EFO) device is provided. The method includes providing an image of the free air ball to an image processor during a wire bonding process, determining whether a characteristic of the free air ball is within a predetermined tolerance, and controlling at least one setting of the EFO system based on the determination step.

These and other aspects of the invention are set forth below with reference to the drawings and the description of exemplary embodiments of the invention.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following Figures.

DETAILED DESCRIPTION

Figure 1:
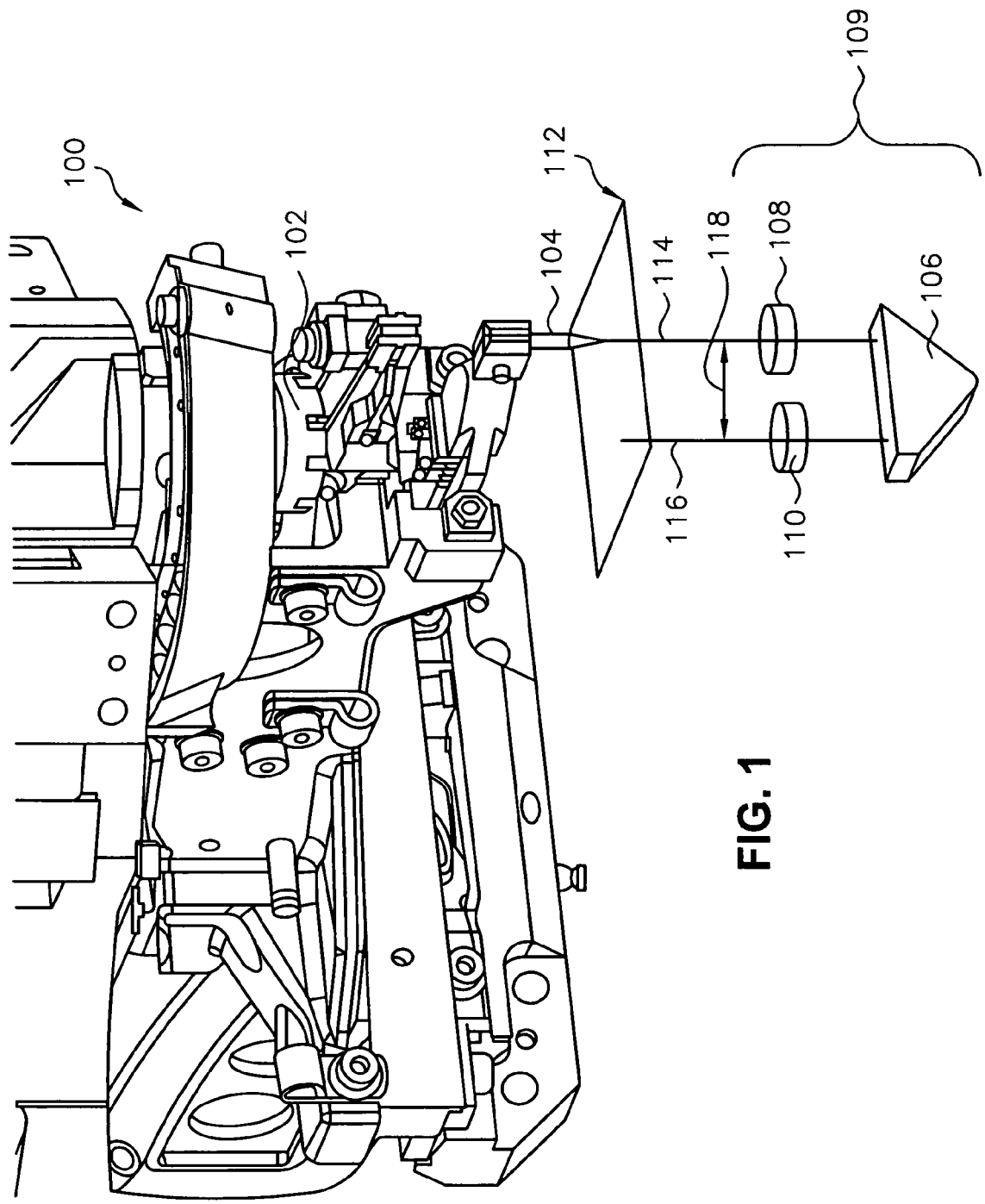
FIG. 1 is a perspective view of an exemplary embodiment of the present invention.

The entire disclosure of U.S. patent application Ser. No. 10/458,535 filed on Jun. 6, 2003 and U.S. patent application Ser. No. 09/912,024 filed on Jul. 24, 2001 are expressly incorporated by reference herein, as if set forth in full.

According to certain exemplary embodiments, the present invention relates to a method and apparatus for measuring the size of a free air ball on the optical system of a wire bonder along with an optical cornercube prism based technology to image the capillary tip.

According to certain exemplary embodiments thereof, the present invention uses the optical system of a wire bonder and a cornercube based offset tool to image the free air ball disposed adjacent to or seated in the wire bonder capillary. The image is then analyzed to measure the ball size. To improve the accuracy of the ball measurement, an illumination system appropriate for producing a desirable image (e.g., high magnification image) is utilized. The optical system may be selected to produce the desired image (e.g., a low magnification image, a high magnification image, or any appropriate resolution, etc.) based on a number of factors including, for example, the size of the free air ball and other processing constraints. The system measures the diameter of a ball during normal operation of a wire bonder. The information is used to control the ball size via the EFO ball formation mechanism commonly found on wire bonders. The purpose of the system is to measure free air ball diameter in an effort to regulate the ball size for ultra fine pitch applications. The wire bonder then uses these values to determine and adjust settings for the EFO system.

According to another exemplary aspect of the invention, the ball size determination and control is a closed loop process. The wire bonder periodically measures the ball diameter and provides this information to the wire bonder so that the EFO system may produce the desired ball size continuously. This allows the free air ball size to be controlled during bonding operations, therefore correcting for any disturbances which would cause a free air ball to exceed its desired diameter tolerance during a wire bonding operation.

Currently, no apparatus or method exists on the wire bonder for measuring free air balls. According to certain exemplary embodiments thereof, the present invention allows the free air ball size to be controlled in a closed loop manner and therefore correct for any disturbances which would cause the free air ball to exceed its desired diameter tolerance during wire bonding operation.

The present invention allows the wire bonder to periodically measure the ball diameter and provide this information to the wire bonder so that the EFO system may produce the desired size ball continuously. A machine vision system may be used to analyze the image and measure the ball diameter. The present invention uses this information to control the ball size via the EFO ball formation mechanism commonly found on wire bonders today.

Referring to FIG. 1, a perspective view of an exemplary embodiment of the present invention is shown. The system is included in wire bonding machine 100, and employs a cornercube 106 (i.e., a cornercube prism 106), having a plurality of internal reflection surfaces (best shown in FIG. 6), located at or below object plane 112A of bonding tool 104 (object plane 112A, shown in FIG. 2A, is part of plane 112 illustrated in FIG. 1).

In an exemplary embodiment, cornercube offset alignment tool 109 (comprising cornercube 106 and lens elements 108, 110), has a total of three internal reflection surfaces, 218, 220, and 221 (best shown in FIG. 6 and described below). In another exemplary embodiment, cornercube 106 may have a plurality of total internal reflective surfaces. For example, cornercube 106 may be formed from or include fused silica, sapphire, diamond, calcium fluoride or other optical glass. Note, optical quality glass, such as BK7 made by Schott Glass Technologies of Duryea, Pa., may also be used. Note also that materials for cornercube 106 can be selected for maximum transmission with respect to the desired operating wavelength.

Figure 2A:
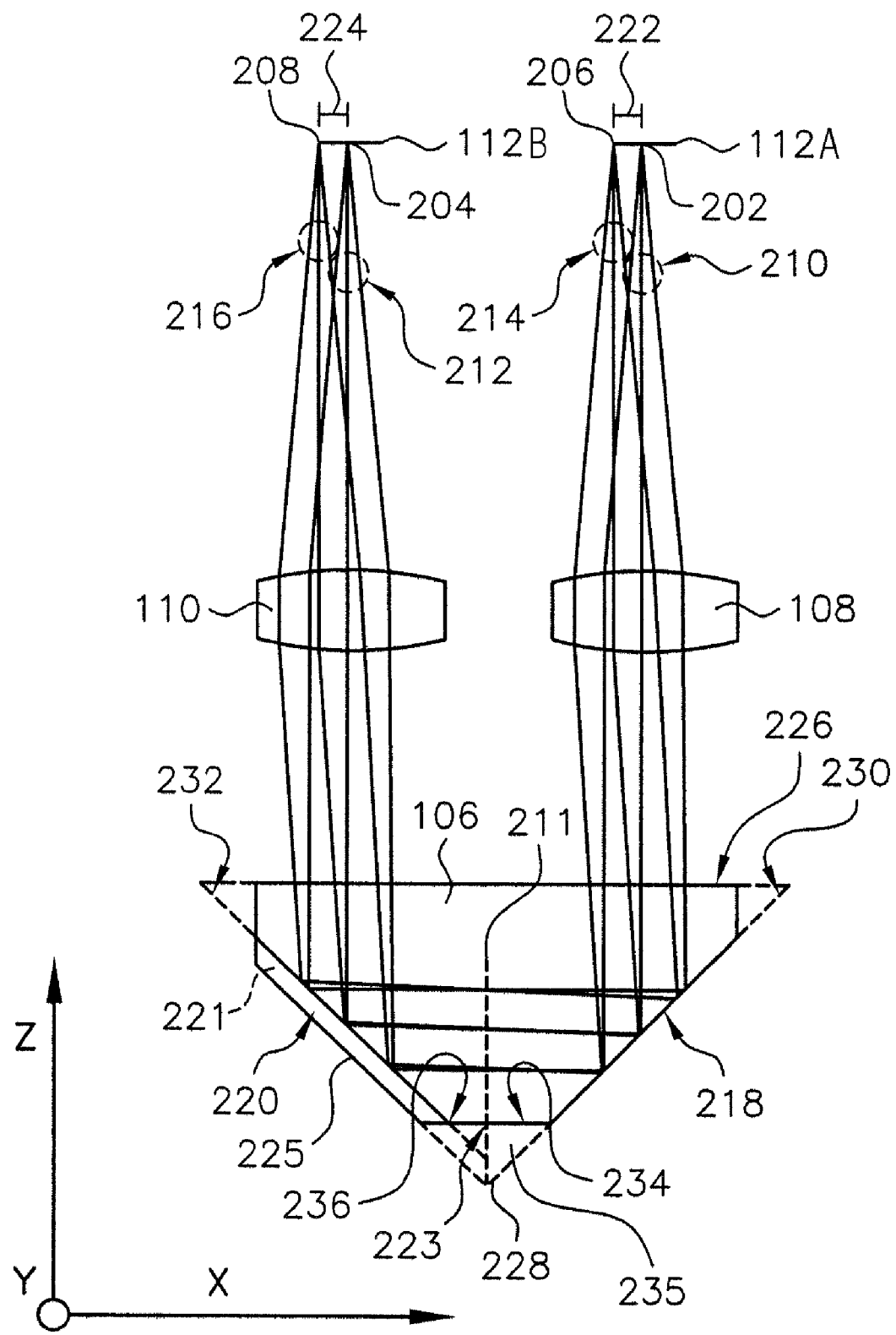
FIG. 2A is a side view of image ray traces according to a first exemplary embodiment of the present invention.

Optical imaging unit 102, such as a CCD imager, CMOS imager or a camera, for example, is mounted above image plane 112B in order to receive an indirect image of bonding tool 104 through cornercube offset alignment tool 109 (image plane 112B, shown in FIG. 2A, is part of plane 112 illustrated in FIG. 1). In another exemplary embodiment, a position sensitive detector (PSD), such as that manufactured by Ionwerks Inc., of Houston, Tex., may also be used as optical imaging unit 102. In such an embodiment, when the hole in bonding tool 104 is illuminated, such as by using an optical fiber for example, the PSD can be utilized to record the position of the spot of light exiting bonding tool 104. It is also contemplated that the PSD may be quad cell or bi-cell detector, as desired.

Figure 2B:
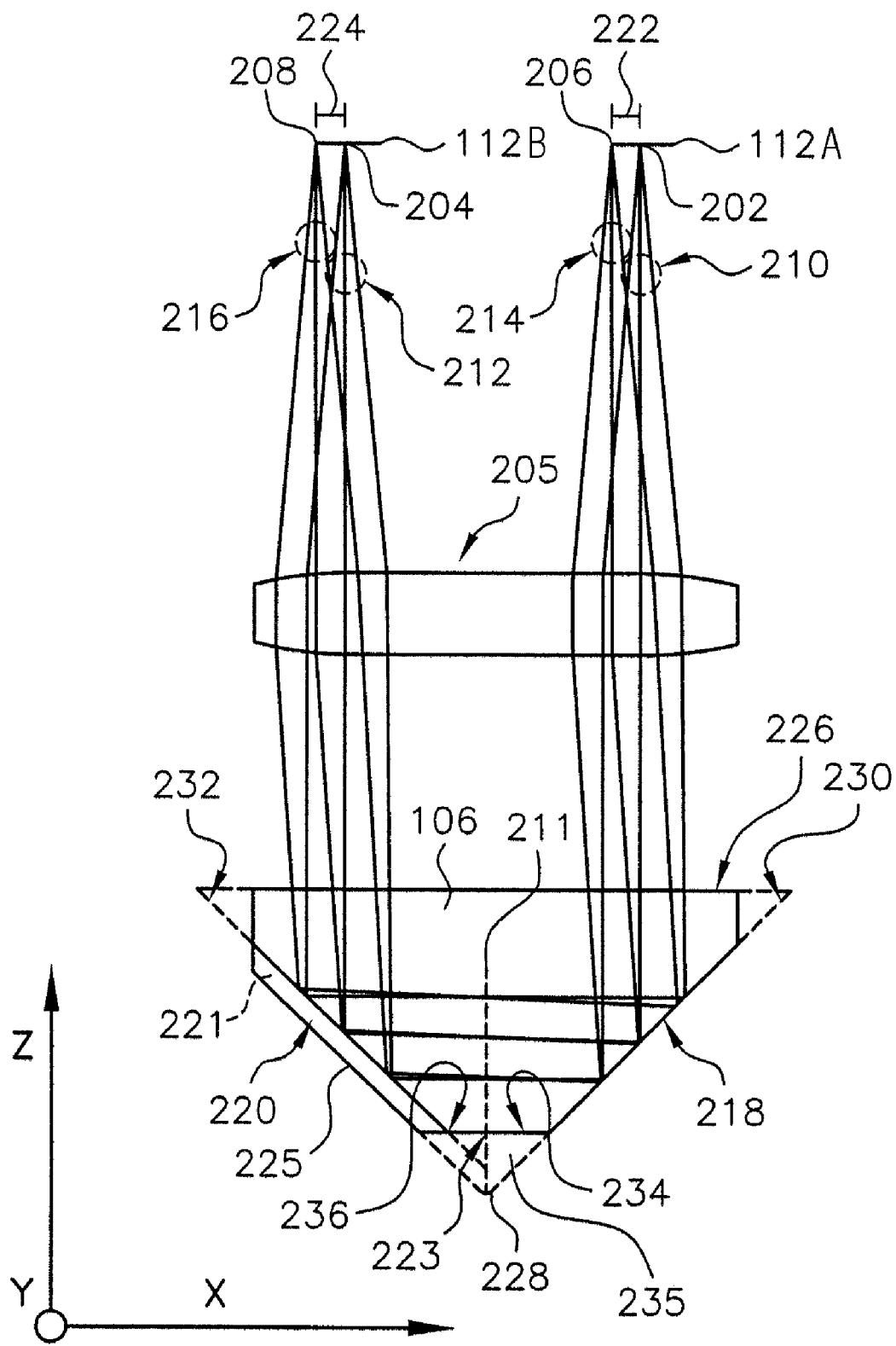
FIG. 2B is a side view of image ray traces according to a second exemplary embodiment of the present invention.

In an exemplary embodiment, the focal point of the vision system (coincident with imaginary plane 211 shown in FIG. 2A) is located above bottom surface 223 (shown in FIG. 2A) of cornercube 106. In addition, the exemplary embodiment includes two preferably identical lens elements 108, 110 located at or below object plane 112A and image plane 112B. Another exemplary embodiment, shown in FIG. 2B, includes a single lens element 205 located below plane 112 and in line with optical axes 114, 116 (shown in FIG. 1). Hereinafter, the combination of cornercube 106 (i.e., a cornercube prism), and lens elements 108, 110 (or lens element 205) will be referred to as assembly 109, cornercube offset tool 109, and/or cornercube offset alignment tool 109.

The image plane of cornercube offset tool 109, including lens elements 108, 110, is coincident with the object plane 112B of optical imaging unit 102. In other words, the image plane of cornercube 106 and lens elements 108, 110 are aligned to bonding tool 104 which also lies in object plane 112A. In an exemplary embodiment, lens elements 108, 110 (or 205) preferably have a unitary magnification factor. First lens element 108 is positioned in a first optical axis 114 between bonding tool 104 and cornercube 106. Second lens element 110 is substantially in the same plane as that of first lens element 108 and is positioned in a second optical axis 116 between optical imaging unit 102 and cornercube 106 (see FIG. 1). In one exemplary embodiment, first and second optical axes 114 and 116 are substantially parallel to one another, and are spaced apart from one another based on specific design considerations of bonding machine 100. In one exemplary embodiment the distance 118 between first optical axis 114 and second optical axis 116 is about 0.400 in. (10.160 mm.) although distance 118 may be as small as about 0.100 in. (2.54 mm) depending on design considerations related to the bonding machine.

FIG. 2A is a detailed side view of image ray traces and illustrates the general imaging concept of an exemplary embodiment of the present invention. In FIG. 2A, exemplary ray traces 210, 214 are separated for clarity to illustrate the relative immunity of the resultant image due to positional changes. The same distance also separates the image points because lens elements 108, 110 serve as unitary magnification relays. FIG. 2A also demonstrates how changes in the bonding tool 104 position are compensated for. For example, once conventional methods have been used to accurately measure the distance between imaging unit 102 and bonding tool 104 (shown in FIG. 1), the present invention is able to compensate for changes in the bonding tool 104 offset position 222 due to changes in the system. The location of bonding tool 104 can be accurately measured because cornercube offset tool 109 images bonding tool 104 onto image plane 112B of the optical system (not shown in this figure).

The reference position of bonding tool 104 is shown as a reflected ray which travels from first position 202 along first optical axis 114 (shown in FIG. 1), as direct image ray bundle 210 from first position 202 through first lens element 108. Direct image ray bundle 210 continues along first optical axis 114 where it then passes through top surface 226 of cornercube 106 onto first internal reflection surface 218. Direct image ray bundle 210 is then reflected onto second internal reflection surface 220, which in turn directs it onto third internal reflective surface 221 (best shown in FIG. 3). Next, direct image ray bundle 210 travels back through top surface 226 of cornercube 106 as reflected image ray bundle 212 along the second optical axis 116 (shown in FIG. 1) and through second lens element 110 to image plane 112B. It is reflected image ray bundle 212 that is detected by imaging unit 102 as image 204.

Consider now that the position of bonding tool 104 is displaced by a distance 222 due to a variation in system temperature, for example. As shown in FIG. 2A, the displaced image of bonding tool 104 is shown as position 206 and imaged along the path of second position ray trace 214. As shown in FIG. 2A, direct image ray bundle 214 travels along a path similar to that of direct image ray bundle 210 from first position 202. Second position 206 image travels as a direct image ray bundle 214, through first lens element 108. Direct image ray bundle 214 then passes through top surface 226 of cornercube 106 onto first internal reflection surface 218. Direct image ray bundle 214 is then reflected onto second internal reflection surface 220, which in turn directs it onto third internal reflection surface 221 (best shown in FIG. 3). Next, direct image ray bundle 214 travels through top surface 226 of cornercube 106 as reflected image ray bundle 216 and through second lens element 110 to image plane 112B. Reflected image ray bundle 216 is viewed as a reflected image by imaging unit 102 as being in second position 208.

Although the above example was described based on positional changes along the X axis, it is equally applicable to changes along the Y axis.

As illustrated, the original displacement of bonding tool 104, shown as offset position 222, is evidenced by the difference 224 in the measured location of bonding tool 104 at second position 208 with respect to reference location 204. As evidenced by the above illustration, a positional shift in assembly 109 does not affect the reflected image as viewed by imaging unit 102. In other words, assembly 109 of the present invention may be translated along one or both the X and Y axes such that the image of the bonding tool 104 appears relatively stationary to imaging unit 102. There will be some minimal degree of error, however, in the measured position of bonding tool 104 due to distortion in the lens system (discussed in detail below).

Referring again to FIG. 2A, vertex 228 (shown in phantom) of cornercube offset alignment tool 109 is located at a position approximately midway between first optical axis 114 and second optical axis 116. To facilitate mounting of cornercube 106, a lower portion 235 of cornercube 106 may be removed providing bottom surface 223, which may be substantially parallel to top surface 226. Removal of lower portion 235 does not affect the reflection of image rays since the image rays emanating from object plane 112A do not impinge upon bottom surface 223.

Exemplary cornercube 106 comprises top surface 226, first reflective surface 218, bottom surface 223, second reflective surface 220, and third reflective surface 221. If top surface 226 is set such that optical axes 114, 116 are normal to top surface 226, first reflective surface 218 will have a first angle 230 of about 45° relative to top surface 226, and a second angle 234 of about 135° relative to bottom surface 223. Likewise, ridgeline 225 (formed by the intersection of second and third reflective surfaces 220 and 221) has similar angles 232 and 236 relative to top surface 226 and bottom surface 223, respectively. In addition, second and third reflective surfaces 220 and 221 are orthogonal to one another along ridgeline 225. In the exemplary embodiment, bottom surface 223 of cornercube 106 may be used as a mounting surface if desired. It should be noted, however, that it is not necessary to form top surface 226 so that the image and reflected rays are normal thereto. As such, cornercube 106 will redirect the incident light or transmit image of bonding tool 104 parallel to itself with an offset equal to 118.

The present invention can be used with light, for example, in the visible, UV and IR spectrum, and preferably with light having a wavelength that exhibits total internal reflection based on the material from which cornercube 106 is fabricated. The material selected to fabricate cornercube offset alignment tool 109 is based on the desired wavelength of light which the tool will pass. It is contemplated that cornercube offset alignment tool 109 may be fabricated to handle a predetermined range of light wavelengths between the UV (1 nm) to the near IR (3000 nm). In a preferred embodiment, the range of wavelength of light may be selected from between about i) 1 and 400 nm, ii) 630 and 690 nm, and iii) 750 and 3000 nm. Illumination may also be provided by ambient light or by the use of an artificial light source (not shown). In one exemplary embodiment, typical optical glass, having an index of refraction of 1.5 to 1.7, may be used to fabricate cornercube 106. Note, the index of refraction is based upon the material chosen for maximum transmission at the desired operating wavelength. In one embodiment, cornercube offset alignment tool 109 has an index of refraction of about 1.517.

Figure 3:
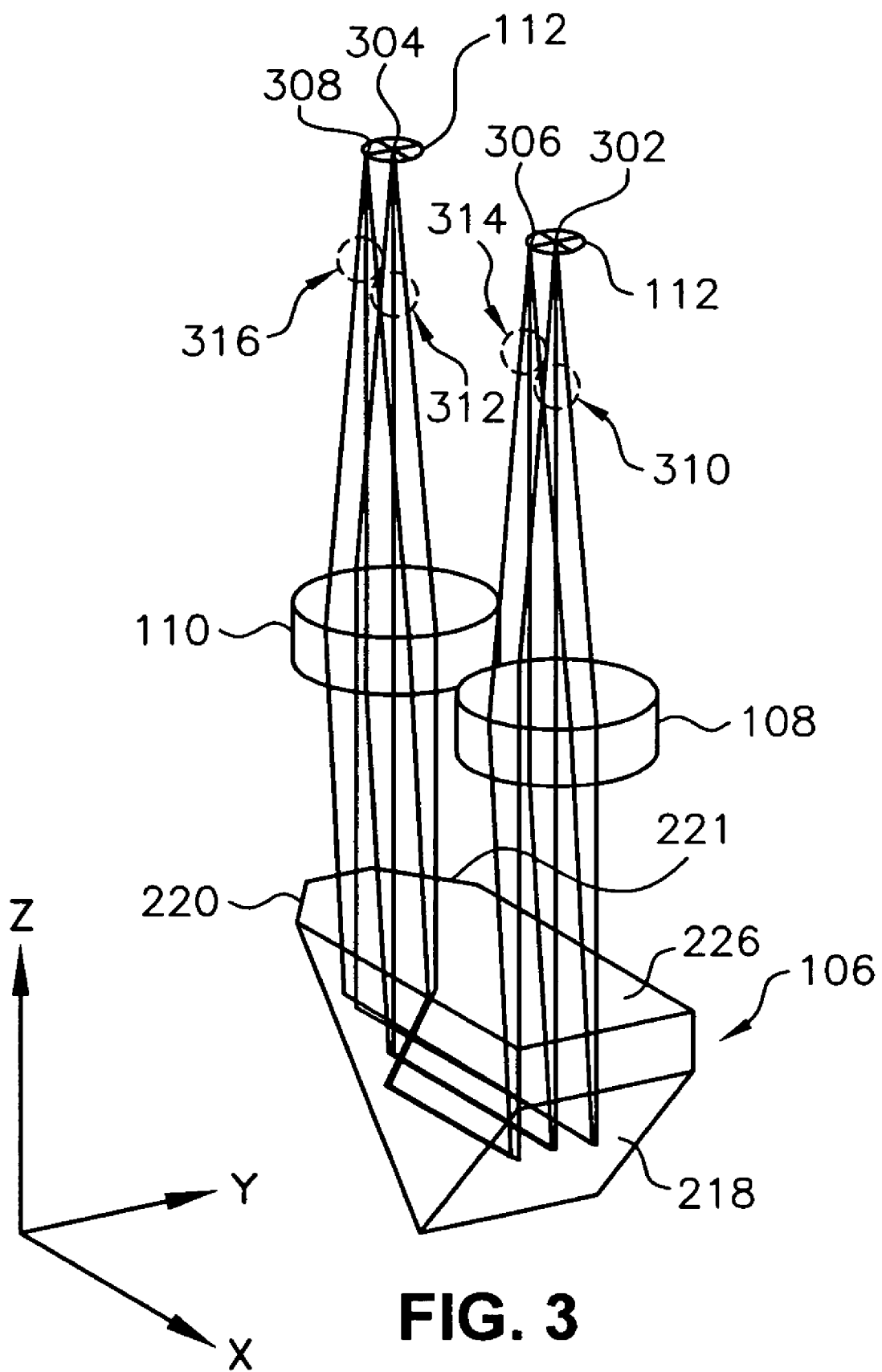
FIG. 3 is a perspective view of image ray traces according to an exemplary embodiment of the present invention.

FIG. 3 is a perspective view of image ray traces according to an exemplary embodiment of the present invention translated in a direction perpendicular to the separation of lens elements 108, 110. The same image properties shown in FIG. 2A are also evident in FIG. 3. For example, the reference position of bonding tool 104 is represented by first position 302 and its image 304 is viewed as a first direct image ray 310 which travels along first optical axis 114 through first lens element 108; passes through top surface 226 of cornercube 106; strikes first reflective surface 218 of cornercube 106; travels through cornercube 106 in a path parallel to top surface 226; strikes second reflective surface 220; strikes third reflective surface 221 before exiting the cornercube 106 through top surface 226 and travels along second optical axis 116 through second lens element 110 onto image plane 112B as ray traces 312 and viewed by imaging unit 102 at position 304. Positional displacement of bonding tool 104 is also shown in FIG. 3 and is illustrated by the path of the ray traces 314, 316 from second position 306 to second viewed position 308.

Figure 4A:
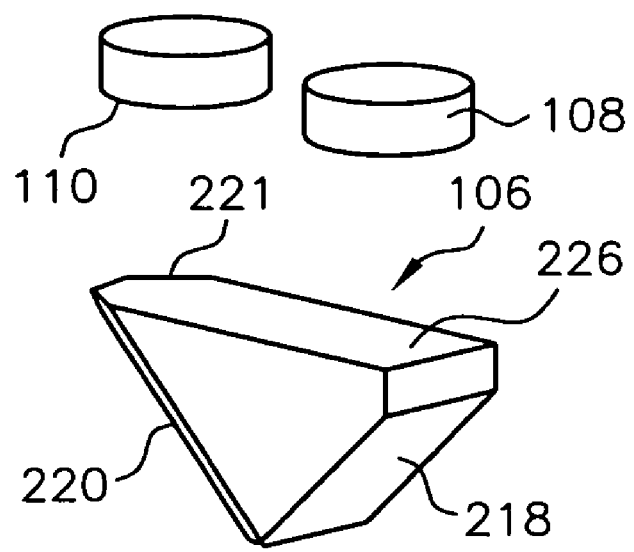
FIGS. 4A and 4B are perspective and side views, respectively, of an exemplary embodiment of the present invention.
Figure 4B:
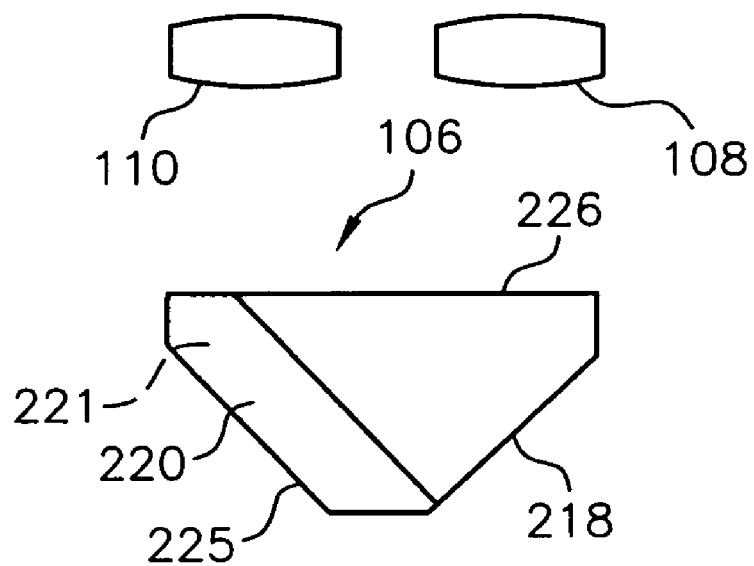

FIGS. 4A-4B are perspective and side views, respectively, of an exemplary embodiment of the present invention illustrating lens elements 108, 110 and cornercube 106. The two lens elements 108, 110 (or 205) are preferably doublets located above the cornercube 106 based on their focal distance from object plane 112A and image plane 112B, and imaginary plane 211. Doublets are preferred based on their superior optical qualities. As illustrated in FIGS. 4A-4B, an exemplary embodiment of cornercube 106 has three internal reflective surfaces, 218, 220 and 221. As shown in FIG. 4B, the exterior edges of lens elements 108, 110 and cornercube 106 are coincident with one another.

Figure 5:
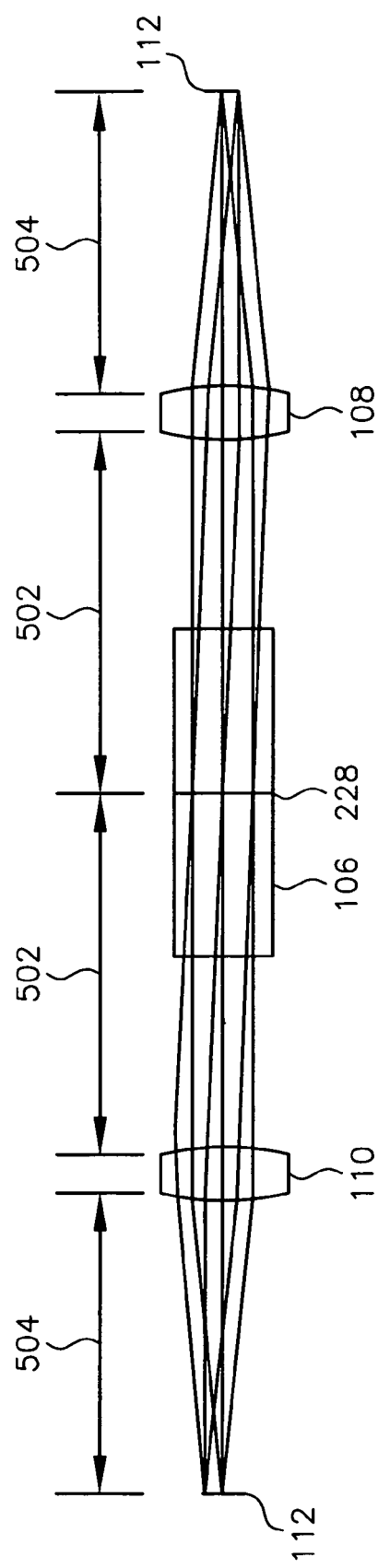
FIG. 5 illustrates the telecentricity of an exemplary embodiment of the present invention.

FIG. 5 illustrates the telecentricity of an exemplary embodiment of the image system of the present invention. As shown in FIG. 5, lens elements 108, 110 produce a unitary magnification and are arranged relative to cornercube 106 such that the telecentricity of the machine vision system is maintained. Note that front focal length 502 from lens element 108 to vertex 228 of cornercube 106 is equal to front focal length 502 from lens element 110 to vertex 228 of cornercube 106. Note also, that back focal length 504 from lens element 108 to object plane 112A is equal to back focal length 504 from lens element 110 to image plane 112B.

Figure 6:
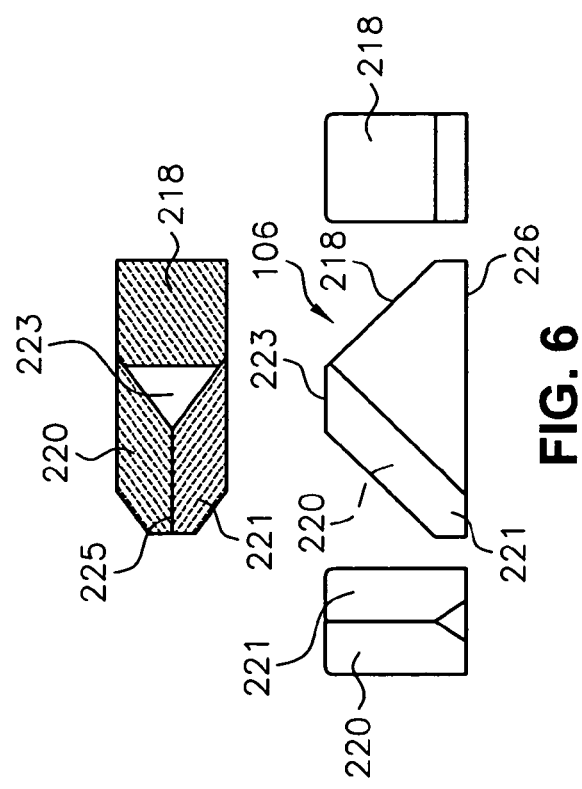
FIG. 6 is a detailed view of an exemplary retroreflective cornercube offset tool according to the present invention.

FIG. 6 is a detailed view of an exemplary cornercube 106 of the present invention. Note that internal reflection surface, 218 and ridgeline 225 allow an image of bonding tool 104 to be translated in the X and Y directions. Note also, that the surfaces of cornercube 106 are preferably ground so that a reflected beam is parallel to the incident beam to within 5 arc seconds.

As shown in FIG. 6, surfaces 220 and 221 are orthogonal to one another along ridgeline 225. In addition, the angle between ridgeline 225 and surface 218 is about 90°. Furthermore, surface 218 and ridgeline form an angle of 45° relative to top surface 226 and bottom surface 223. Note also, that surfaces, 218, 220, and 221 meet to form triangular shaped bottom surface 223, which may be used to facilitate mounting of cornercube 106.

Figure 7A:
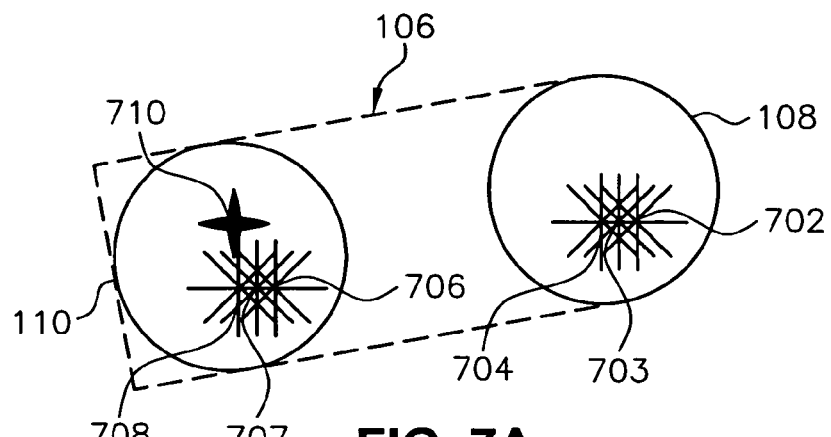
FIGS. 7A-7C illustrate the effect of tilt about the vertex of the cornercube tool of the exemplary vision system.
Figure 7B:
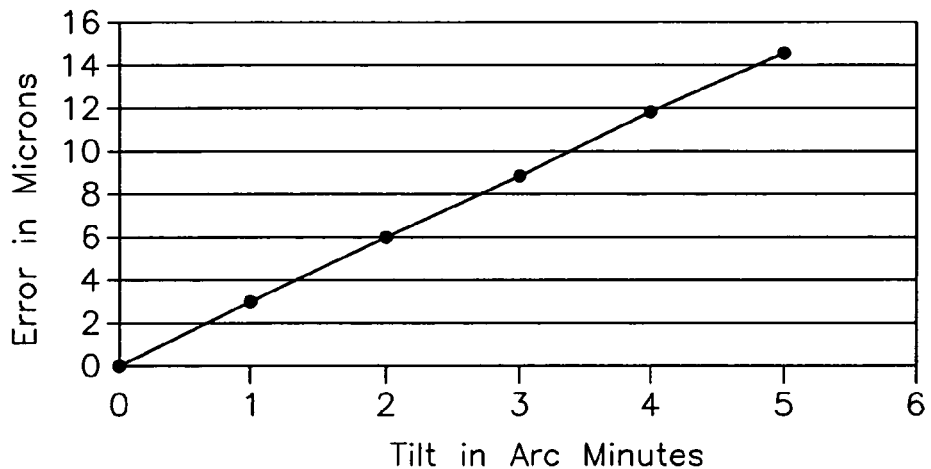
Figure 7C:
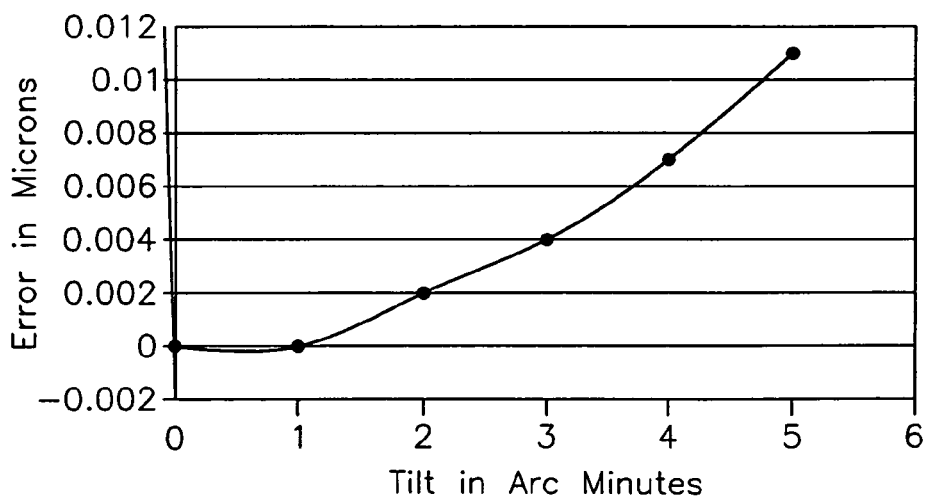

FIGS. 7A-7C illustrate the effect of tilt about the orthogonal axes of cornercube offset alignment tool 109 in an exemplary vision system. FIG. 7A is an overhead view of lens elements 108, 110 and cornercube 106. Exemplary image origins, 702, 703, 704, 706, 707 and 708 correspond to positions of image ray traces 210, 214 (shown in FIG. 2A). Note that optic axis position 710 corresponds to the position where the image of bonding tool 104 (shown in FIG. 1) would be if cornercube 106 was not tilted along the Z axis.

FIGS. 7B-7C are graphs of the effect of tilt around the Z axis in terms of tilt in arc minutes vs. error in microns. FIG. 7B shows the effect of tilt around the Z axis versus error and image location along the Y axis. FIG. 7C shows the effect of tilt around the Z axis versus error and image location along the X axis.

Figure 8B:
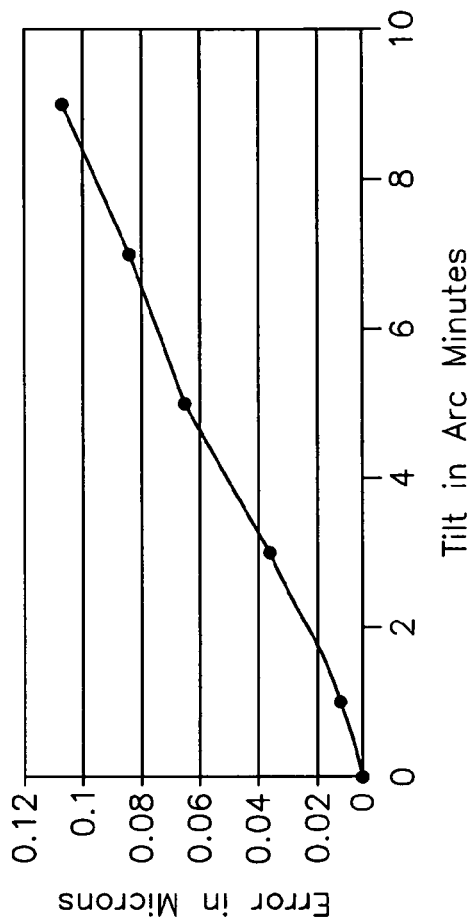
FIGS. 8A-8C illustrate the effect of tilt about the X and Y axis of the exemplary vision system.
Figure 8C:
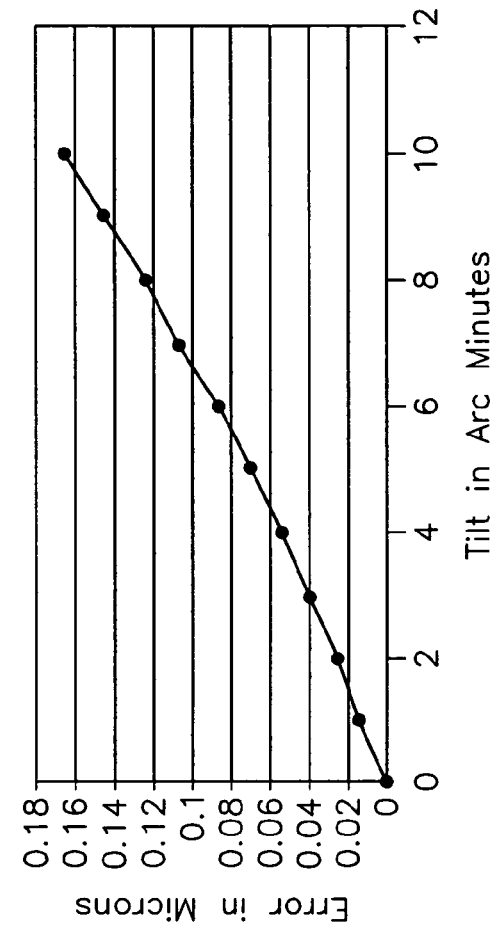
Figure 8A:
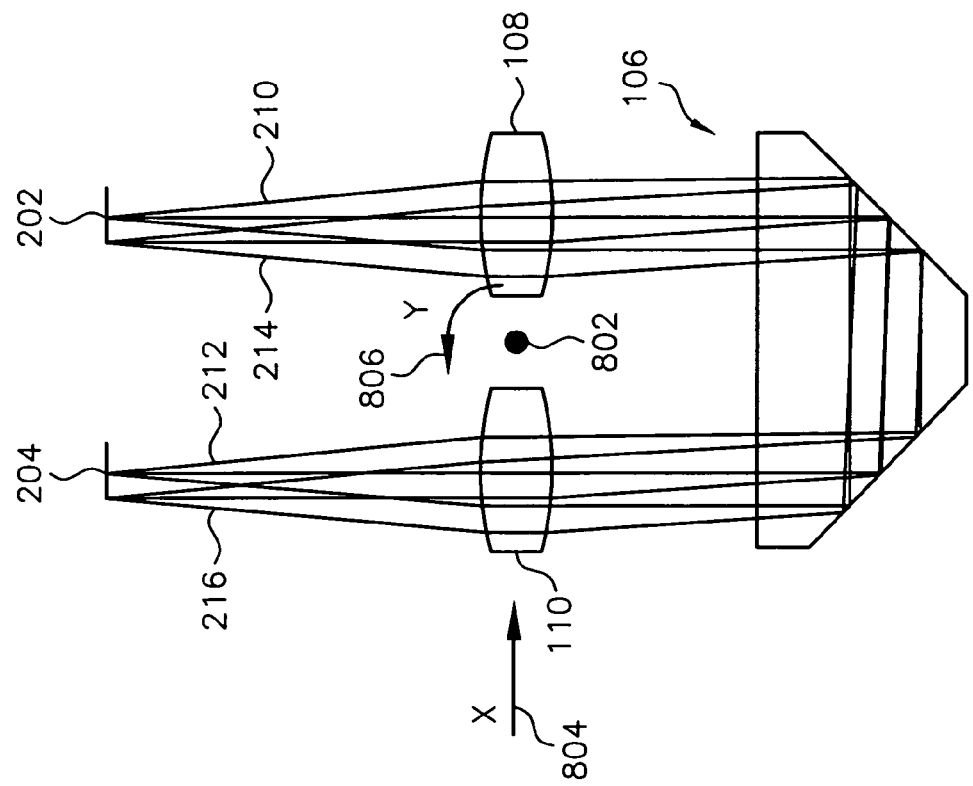

FIGS. 8A-8C illustrate the effect of tilt about the X and Y axis of the exemplary vision system. FIG. 8A is an additional side view of exemplary image ray traces 210, 212, 214, 216. In FIG. 8A, arrow 804 and dot 802 are used to depict the X and Y axes, respectively, and arrow 806 depicts tilt.

FIGS. 8B-8C are graphs of the effect of tilt around the X and Y axes in terms of tilt in arc minutes vs. error in microns. FIG. 8B shows the effect of tilt around the X axis versus error and image location along the Y axis. FIG. 8C shows the effect of tilt around the Y axis versus error and image location along the X axis.

Figure 9:
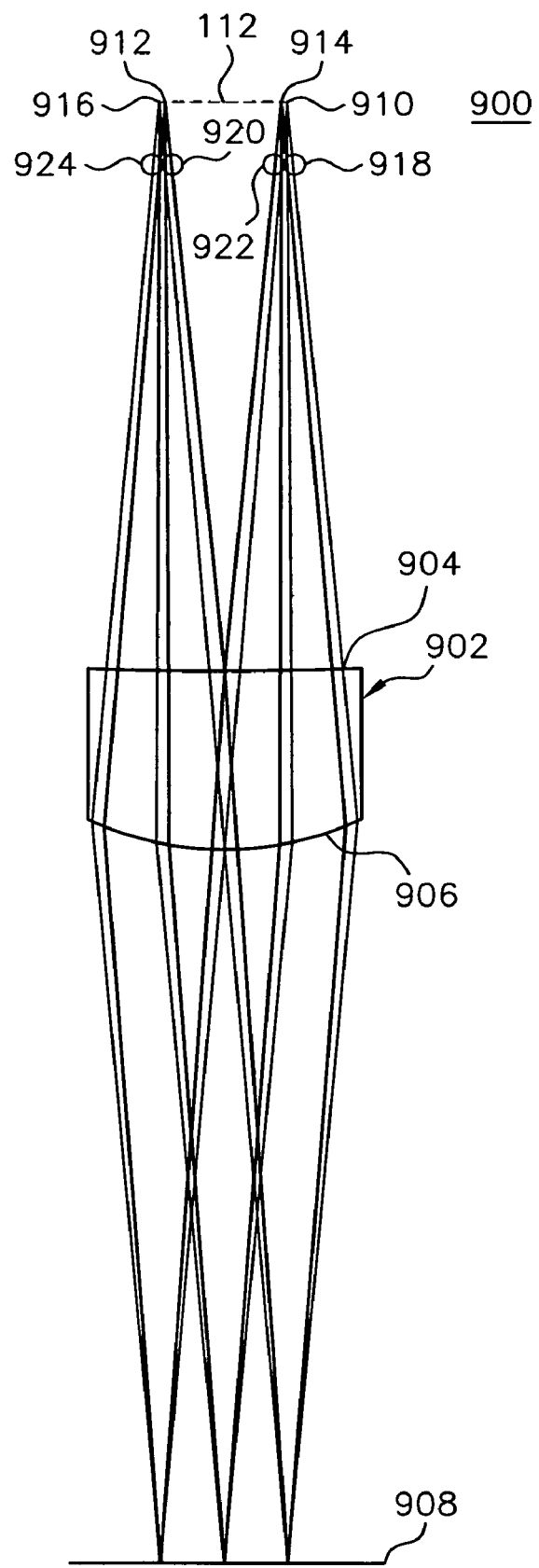
FIG. 9 is a side view of image ray traces according to a third exemplary embodiment of the present invention.

FIG. 9 is a detailed side view of image ray traces according to a third exemplary embodiment of the present invention. In FIG. 9, the reference position of bonding tool 104 is shown as a reflected ray which travels from first position 914 (on object plane 112A which is part of illustrated plane 112) along first optical axis 114 (shown in FIG. 1), as direct image ray bundle 922 from first position 914 through lens element 902. Note that in this exemplary embodiment, lens element 902 has a relatively planar, upper surface 904 and a convex lower surface 906. Direct image ray bundle 922 continues along first optical axis 114 where it then passes through upper surface 904 of lens element 902, and in turn through convex surface 906. Direct image ray bundle 922 is then reflected onto total reflective surface 908. In a preferred embodiment, total reflective surface 908 is a mirror. Next, direct image ray bundle 922 travels back through lens element 902 as reflected image ray bundle 920 along second optical axis 116 (shown in FIG. 1) and onto image plane 112B. It is reflected image ray bundle 920 that is detected by imaging unit 102 (shown in FIG. 1) as image 912. Similarly, positional displacement of bonding tool 104 is also shown in FIG. 9 and is illustrated by the path of direct image ray bundles 918, 924 from second position 910 to second viewed position 916.

Figure 14:
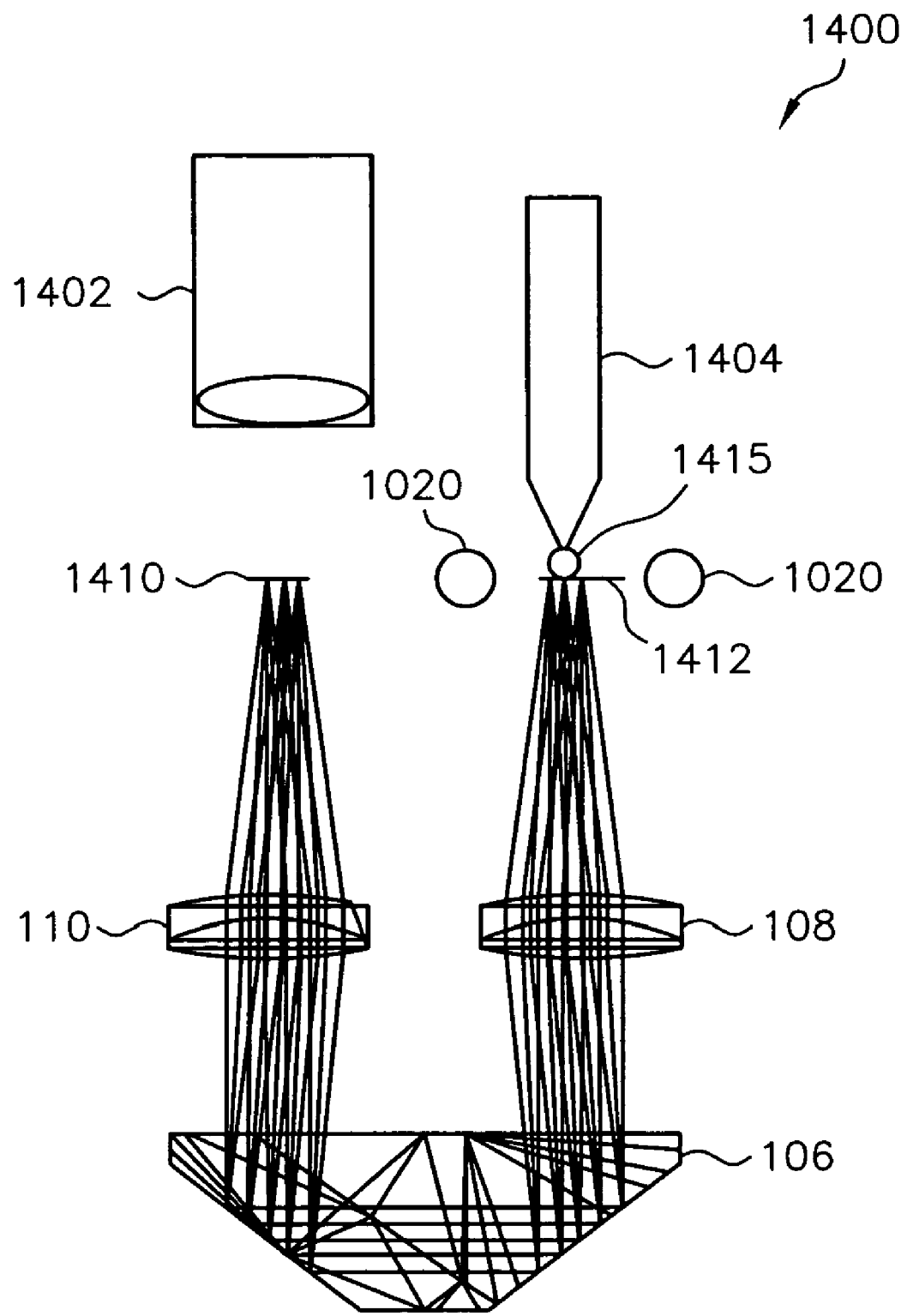
FIG. 14 is a side view illustrating an apparatus for measuring free air balls with a wire bonder optical system according to an exemplary embodiment of the present invention.

FIG. 14 illustrates an apparatus 1400 for measuring free air balls 1415 used with a wire bonder (not shown in this figure) according to an exemplary embodiment of the present invention. As shown in FIG. 14, apparatus 1400 comprises optical imager 1402, such as imagers described above with respect to other exemplary embodiments, lenses 108, 110, cornercube offset tool 106, and illuminator 1220, such as a ring illuminator for example.

As shown in FIG. 14, lens 108 is positioned between object plane 1412 and offset tool 106, while lens 110 is positioned between imager 1402 and offset tool 106. In one non-limiting exemplary embodiment, lens 110 and lens 108 are in the same horizontal plane. Desirably, apparatus 1400 comprises both low and high magnifications as desired.

In use, free air ball 1415 is formed by an EFO system (not shown) at a lower portion of capillary 1404. Imager 1402 is able to view free air ball 1415 (from object plane 1412) as an image formed at image plane 1410 via lens 108, cornercube offset tool 106 and lens 110.

The image of a free air ball 1415 is provided by optical imager 1402 to an image processing system (not shown in this figure) where dimensions, such as the diameter, of free air ball 1415 is determined. Based on this determination the parameters of the EFO system may be adjusted in a closed loop feed-back arrangement, as necessary, to control the diameter of further free air balls to continuously ensure proper bonding. Thus, the inventive controlled closed loop system may correct for anomalies which would otherwise cause free air ball 1415 to exceed its desired diameter tolerance or to have a diameter too small during the wire bonding operation.

Figure 15:
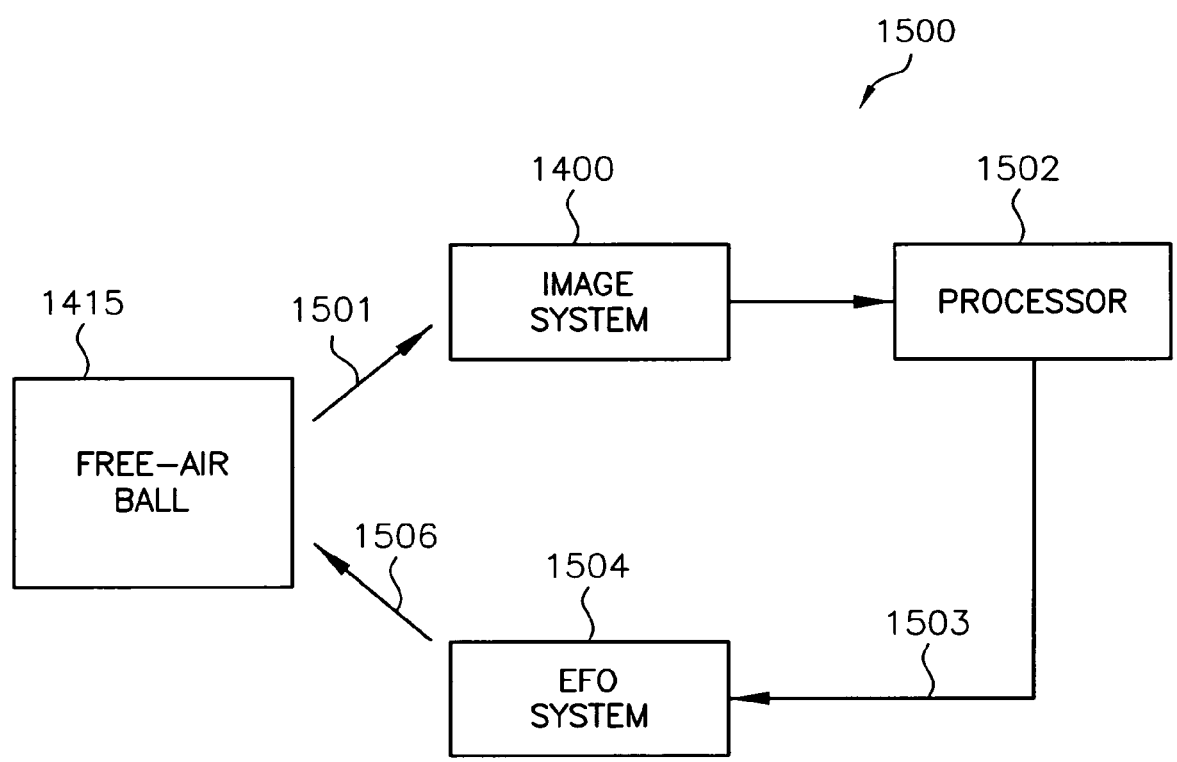
FIG. 15 is a schematic block diagram of an exemplary apparatus for measuring and adjusting free air balls with a wire bonder optical system.

FIG. 15, illustrates an exemplary schematic block diagram of a closed loop system 1500. As shown in FIG. 15, an image 1501 of free air ball 1405 is received by image system 1400. The image is provided by image system 1400 to processor 1502, where the diameter of free air ball 1415 is determined. Based on this determination a signal 1503 is provided to EFO system 1504 to adjust the parameters of EFO system 1504 so as to adjust the output 1506 of EFO system 1504, thus effecting the diameter of subsequent free air balls 1415.

Figure 10A:
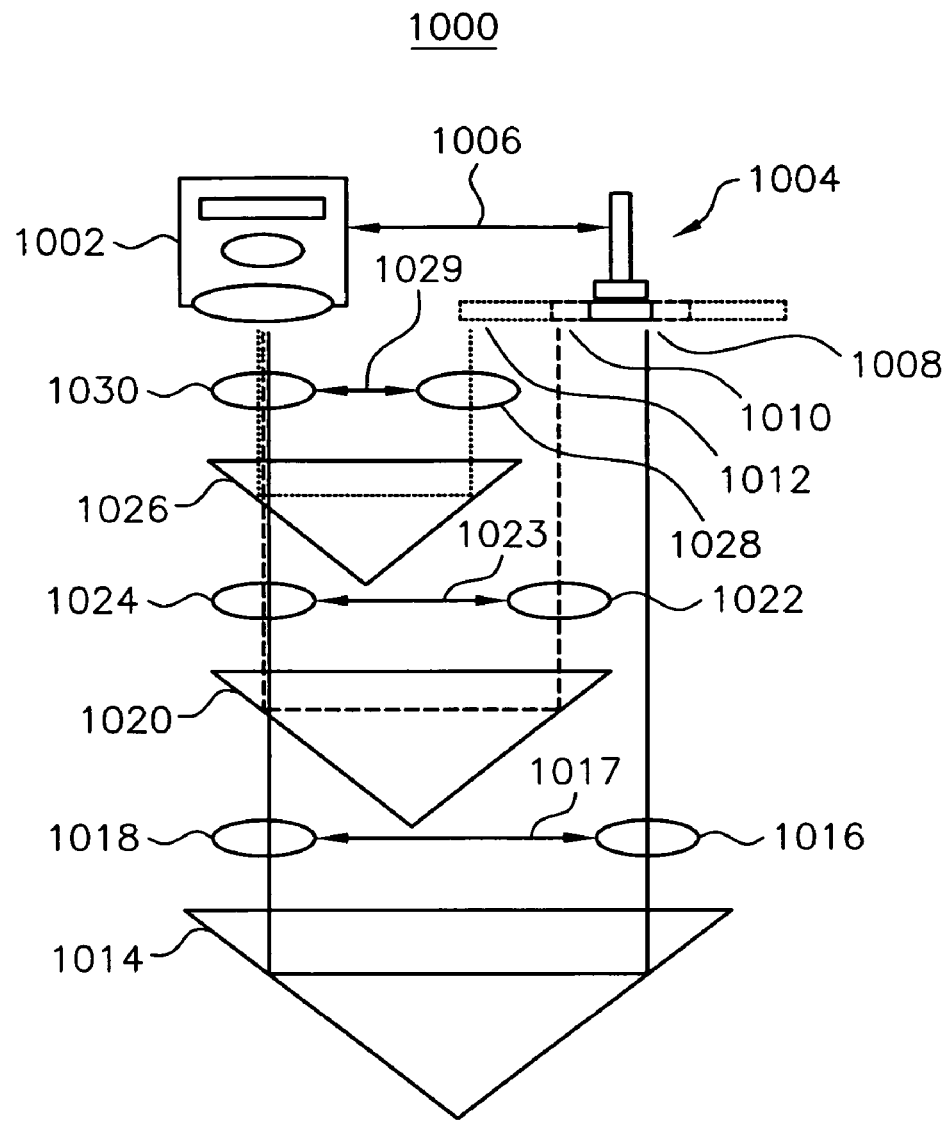
FIGS. 10A-10D are various views of a fourth exemplary embodiment of the present invention.

Referring to FIG. 10A, a side view of yet another exemplary embodiment of the present invention is illustrated. In FIG. 10A, vision system 1000 comprises multiple cornercube prisms 1014, 1020, 1026 and respective lens sets 1016/1018, 1022/1024, 1028/1030, are used as an alignment means to improve the accuracy of die attach and pick/place of assemblies, such as die 1008, 1010, 1012. This will, in effect, replace a conventional up-looking camera (i.e., a die camera—not shown) found in most conventional mid to high accuracy placement (e.g., die attach and pick/place) equipment. In the exemplary embodiment, ganged multiple cornercubes 1014, 1020, 1026 with varied lens separation distances, 1017, 1023, 1029, respectively, provide an indirect image of a location of die 1008, 1010, 1012, respectively. It is understood by those of skill in the art that only one die is viewed at a time. The use of multiple cornercube/lens combinations allows for use with a variety of different sized die. In other respects, such as the materials used, the method of reflection, etc., this exemplary embodiment is similar to the first exemplary embodiment.

As mentioned above, this variation of the first exemplary embodiment accommodates various die sizes which these types of equipment accept and place. In this exemplary embodiment, down looking optical detector 1002, such as a camera, (e.g., a substrate camera) views features on the downward side of the component to be placed, such as die, 1008, 1010, or 1012. These features of die 1008, 1010, 1012, can then be identified via a vision system (not shown) to accurately place the die on the substrate (not shown) using pick tool 1004 based in part on the predetermined distance 1006 between pick/place tool 1004 and optical detector 1002. It is understood by those of skill in the art, that pick tool 1004 may be either a rotating or non-rotating pick tool. This exemplary embodiment further preserves the optical advantages with respect to accuracy of the cornercube alignment described above in the first exemplary embodiment.

Figure 10B:
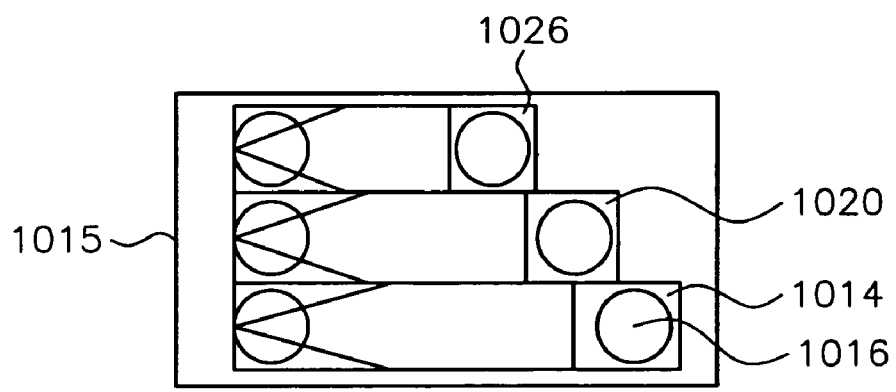

FIG. 10B is a plan view of the exemplary embodiment illustrated in FIG. 10A. In FIG. 10B, cornercube prisms 1014, 1020, 1026 are placed adjacent one another to form assembly 1015. Cornercube prisms 1014, 1020, 1026 may be bonded to one another, if desired using conventional adhesive means, or may be held in alignment with one another using a mechanical device, such as a clamp or a containment assembly, for example. The latter approach allowing for simple replacement of individual cornercube/lens assemblies to accommodate different sized die, as desired. Although the exemplary embodiment is shown with three cornercube offset tools, it is understood that at least two cornercube offset tools may be used.

Figure 10C:
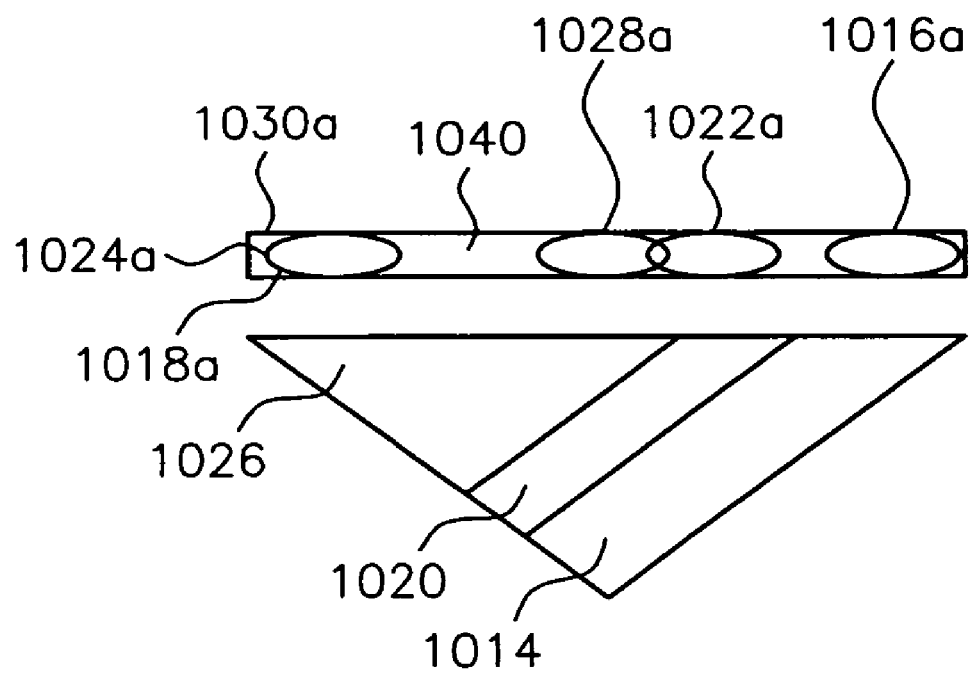
Figure 10D:
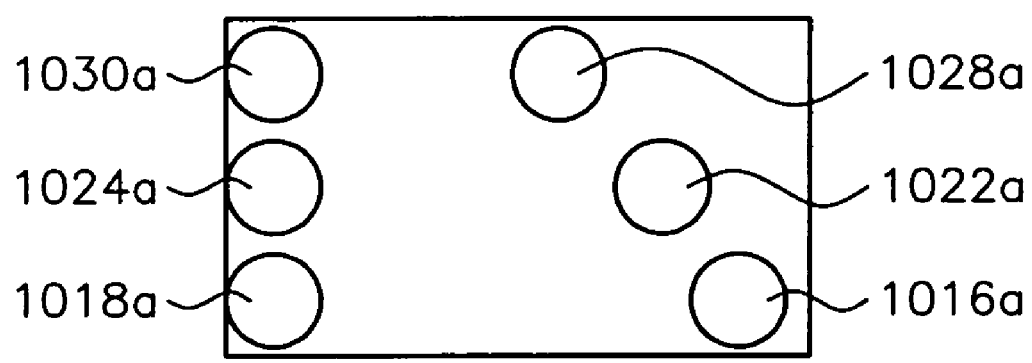
Figure 11:
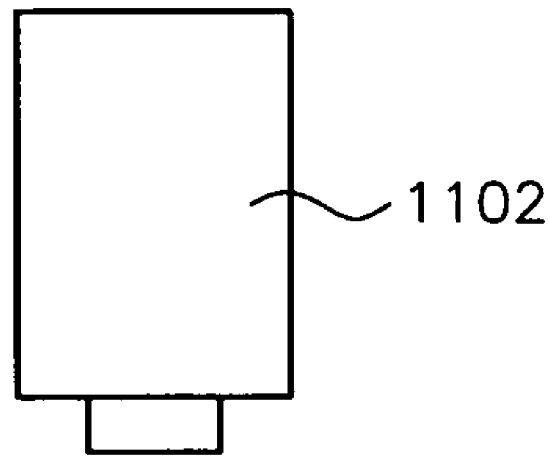
FIG. 11 is a vision system according to the prior art.
Figure 11:
Figure 11:
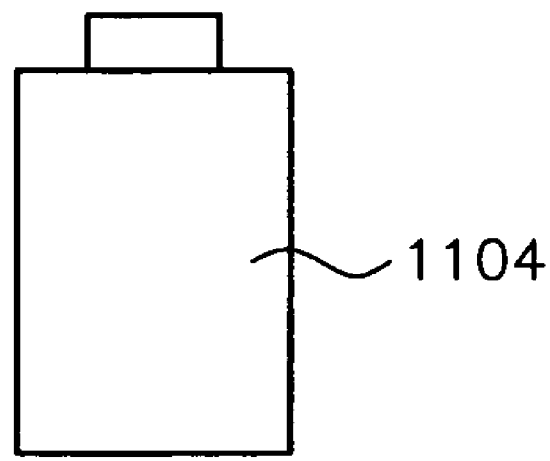

Lenses 1016, 1018, 1022, 1024, 1028, 1030 may be formed from a unitary optical member rather than individual lenses if desired to simplify assembly of the system. Such an approach is shown in FIGS. 10C-10D. As shown in FIG. 10C, lens sheet 1040 has imbedded within optical members 1016*a*, 1018*a*, 1022*a*, 1024*a*, 1028*a*, 1030*a* that are substantially equivalent to individual lenses 1016, 1018, 1022, 1024, 1028, 1030.

FIGS. 12A-12F illustrate further embodiments of the present invention. In these exemplary embodiments, a cornercube prism is used to improve the accuracy of alignment of fibers. As in the previous exemplary embodiment, the use of a cornercube prism allows for the use of a single optical detector instead of the conventional multiple detector systems.

Figures 12A, 12B:
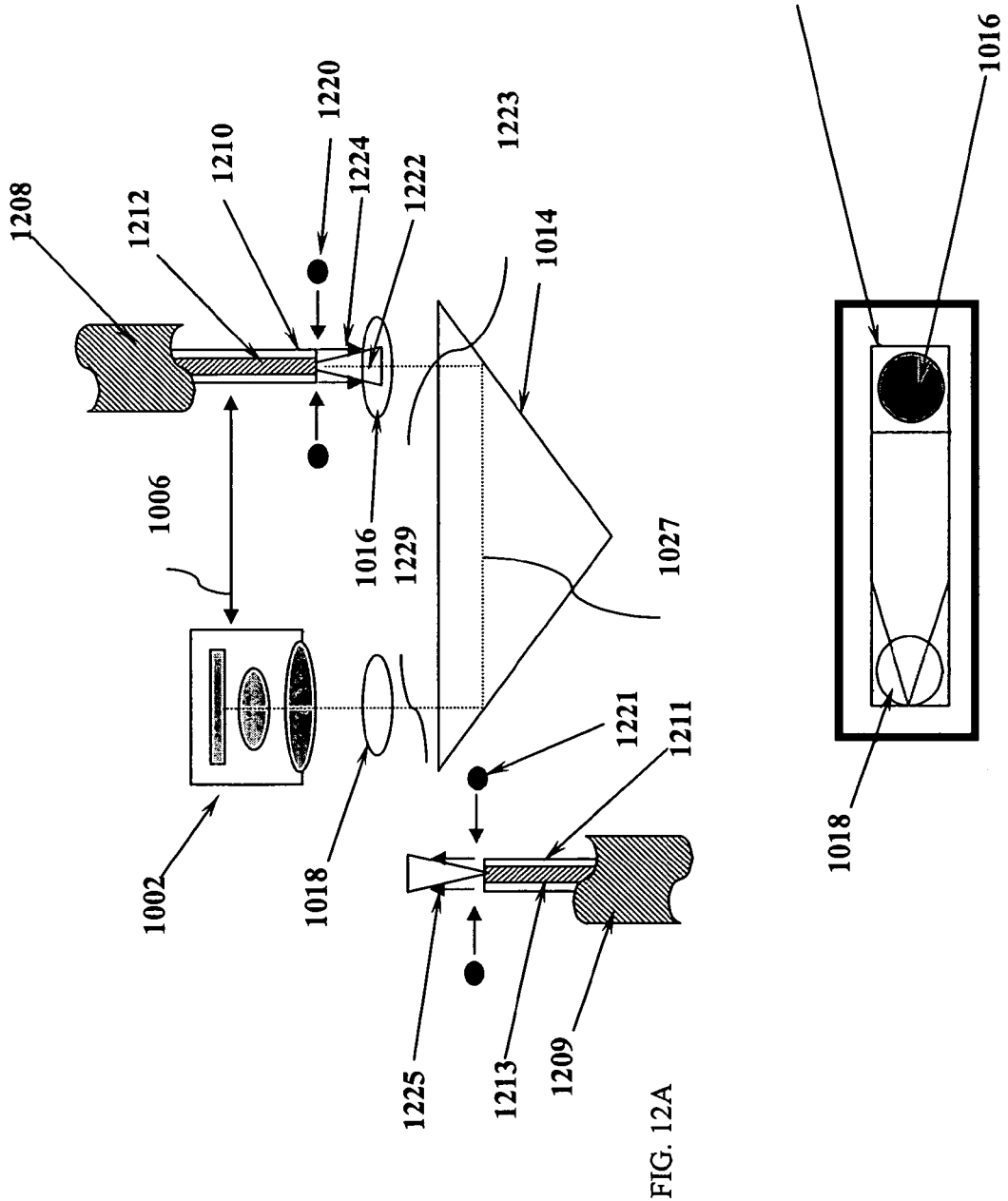
FIG. 12A-12F are illustrations of a fifth exemplary embodiment of the present invention.

Referring to FIG. 12A, the exemplary embodiment includes cornercube prism 1014, lenses 1016, 1018, dark field illumination systems 1220, 1221 (which are well known to those practicing the art) to illuminate the fiber cladding edge 1210, 1211 of fiber cores 1212, 1213, respectively (which in turn produces reflections 1224, 1225 to outline cladding edges 1210, 1211), and optical detector 1002. In this exemplary embodiment, downward facing fiber 1208 is viewed by downward looking optical detector 1002, such as a camera (i.e., a substrate camera). Downward looking optical detector 1002 detects the emission of light 1222 from fiber core 1212 and is then be able to determine the proper offset 1027 between the optical fiber centerline 1223 and central ray 1229 of downward looking optical detector 1002. As is further shown in FIG. 12A, downward facing fiber 1208 and optical detector 1002 are offset from one another by predetermined distance 1006. Also illustrated is upward facing fiber 1209 and associated dark field illumination system 1221 positioned adjacent cornercube prism 1014.

FIG. 12B is a plan view of the exemplary embodiment illustrated in FIG. 12A illustrating the relative positions of lenses set 1016/1018, and cornercube prism 1014.

Figure 12C:
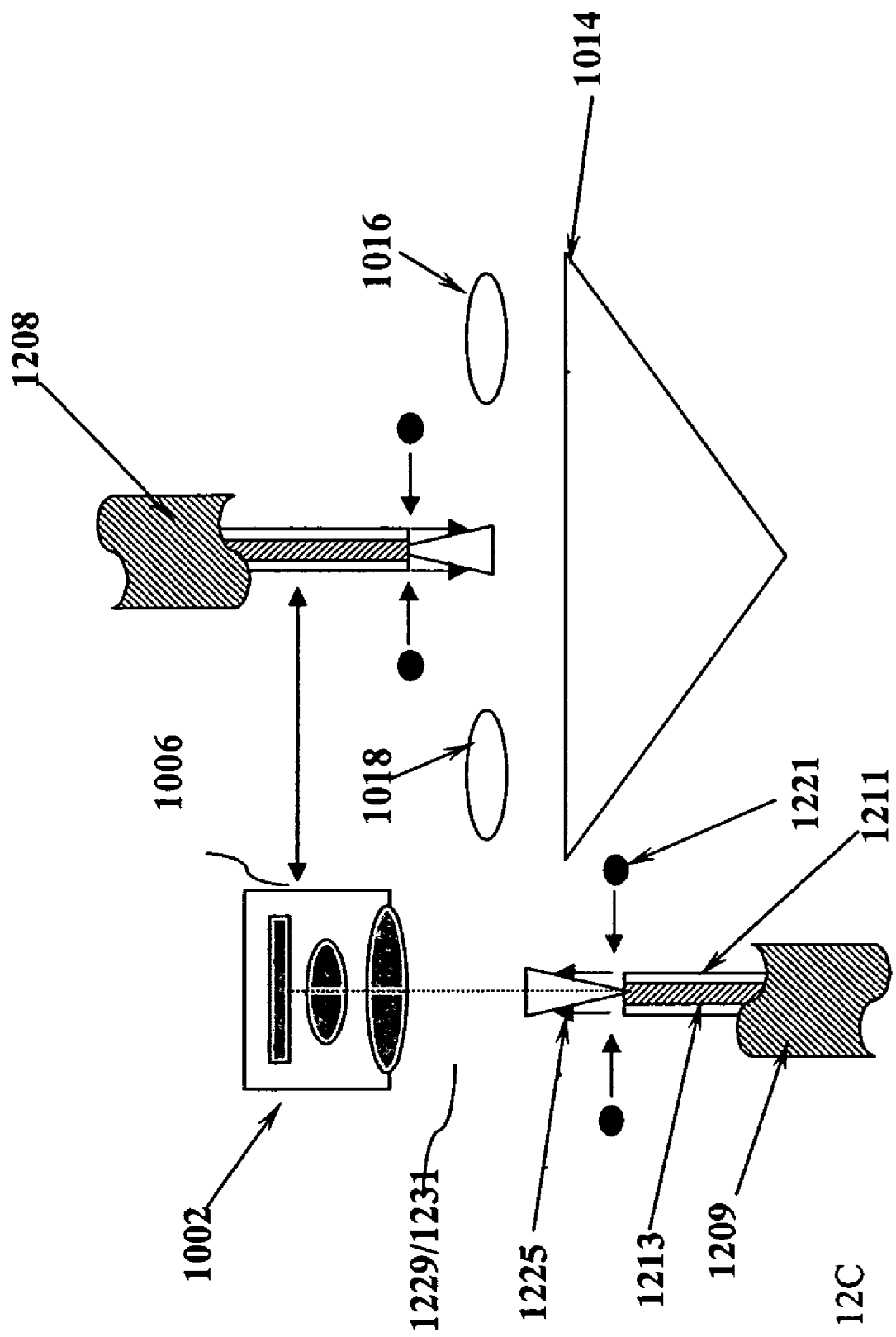

In FIG. 12C, downward looking optical detector 1002 and downward facing fiber 1208 are then repositioned such that central ray 1229 of downward looking optical detector 1002 is aligned with fiber centerline 1231 of upward facing fiber 1209. Once again, dark field illumination system 1221 is used to illuminate upward facing fiber 1209 for recognition by the vision system to ensure proper alignment with optical detector 1002.

Figure 12D:
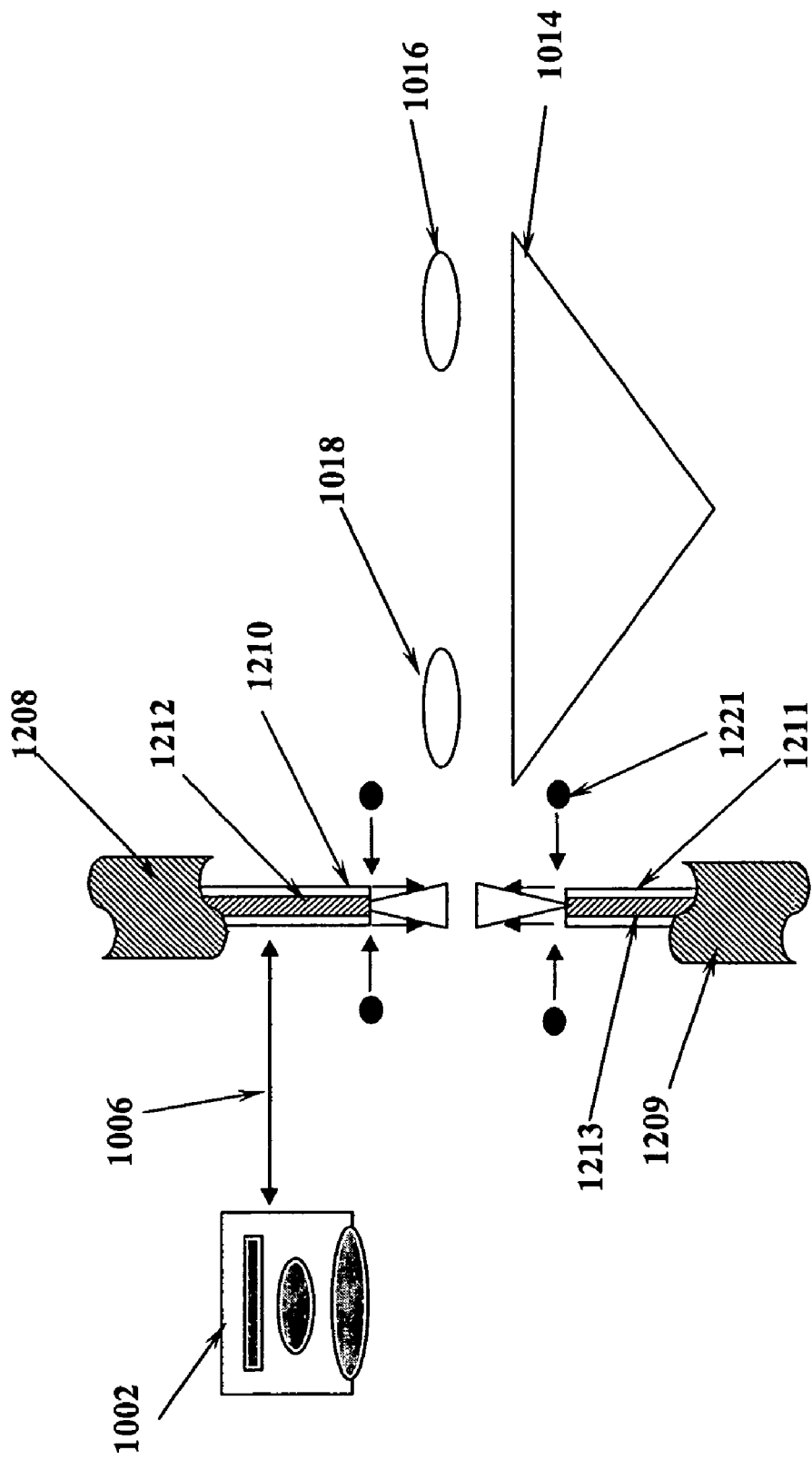

Next, and as shown in FIG. 12D, optical detector 1002 and downward facing fiber 1208 are again repositioned based on the offset 1027 determined during the process discussed above with respect to FIG. 12A. As a result, downward facing fiber 1208 and upward facing fiber 1209 are aligned with one another.

Figure 12E:
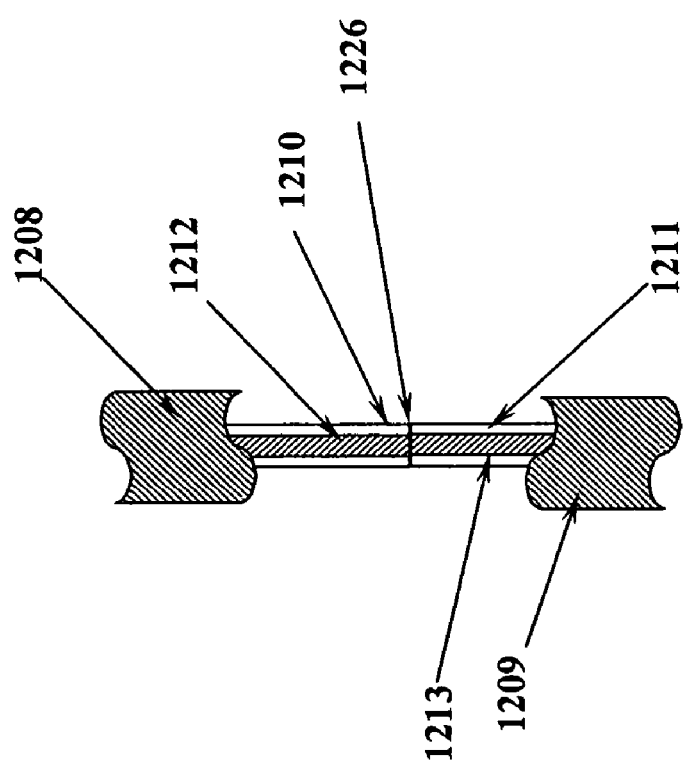

As shown in FIG. 12E, optical fibers 1208 and 1209 are then joined at junction 1226 using conventional techniques, such as fusing the fibers together using radiation (not shown), or mechanical means, for example.

Figure 12F:
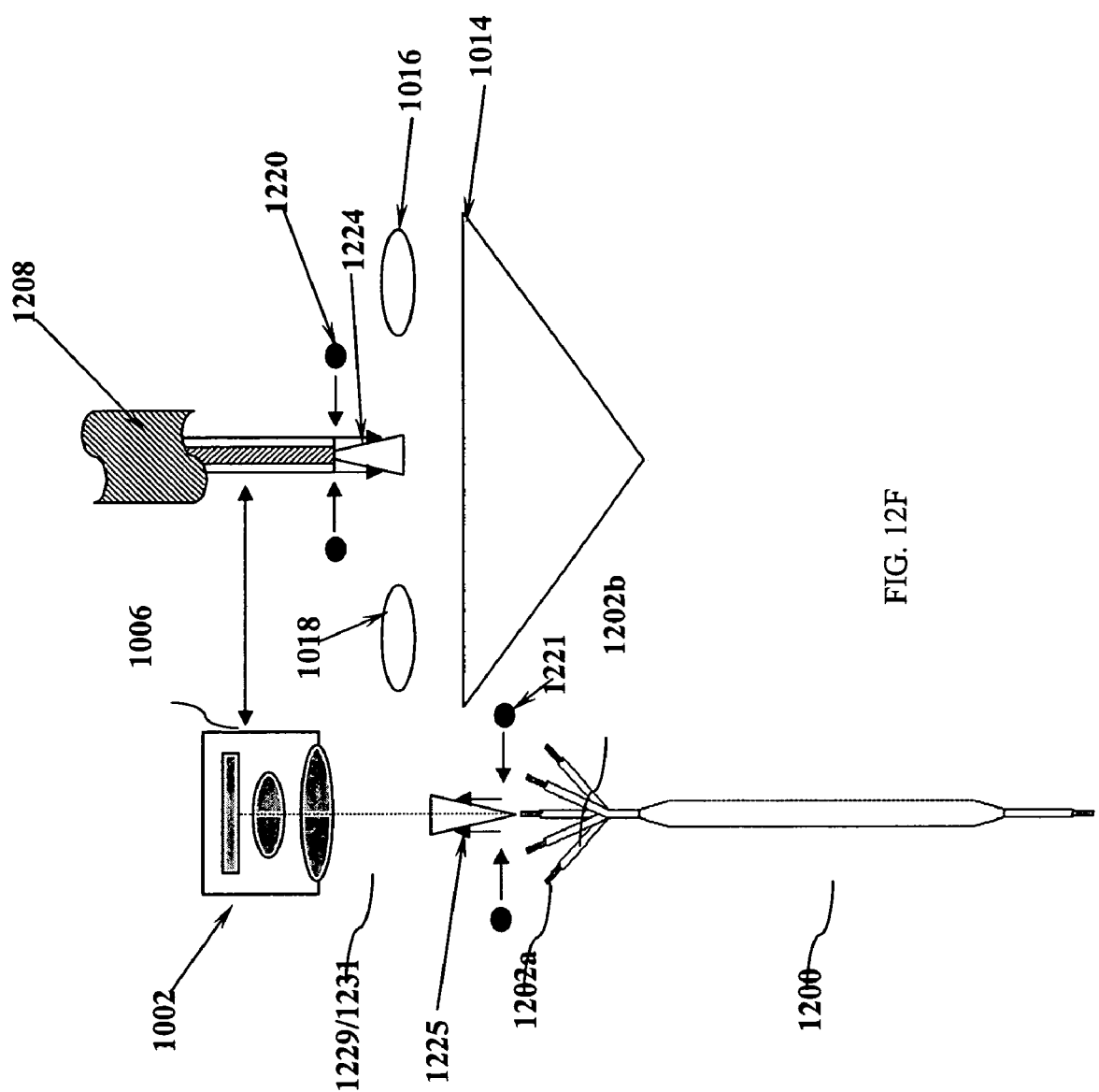

FIG. 12F illustrates yet a further embodiment of the present invention. In this exemplary embodiment, a cornercube offset alignment tool 1014 is used to align individual fibers (sub-fibers) 1202*a* of a fiber optic splitter 1200 with respective individual optical fibers 1208, etc. As in the previous exemplary embodiment, the use of a cornercube offset alignment tool allows for the use of a single optical detector instead of the conventional multiple detector systems. As the steps leading up to alignment and coupling of optical fiber 1208 and sub-fiber 1202*a, b*, etc., are similar to the above exemplary embodiment, they are not repeated here.

Once the first sub-fiber is aligned with single fiber 1208, the process is repeated for a further sub-fiber, such as 1202*b*, and another single fiber (not shown).

Of course the exemplary embodiment is not limited to the fiber optic bundle of a fiber optic splitter being below optical detector 1002. The embodiment also contemplates that the relative positions of fiber optic bundle 1200 and optical fiber 1208 are reversed, such that fiber optic bundle 1200 is positioned above cornercube prism 1014.

Figure 13A:
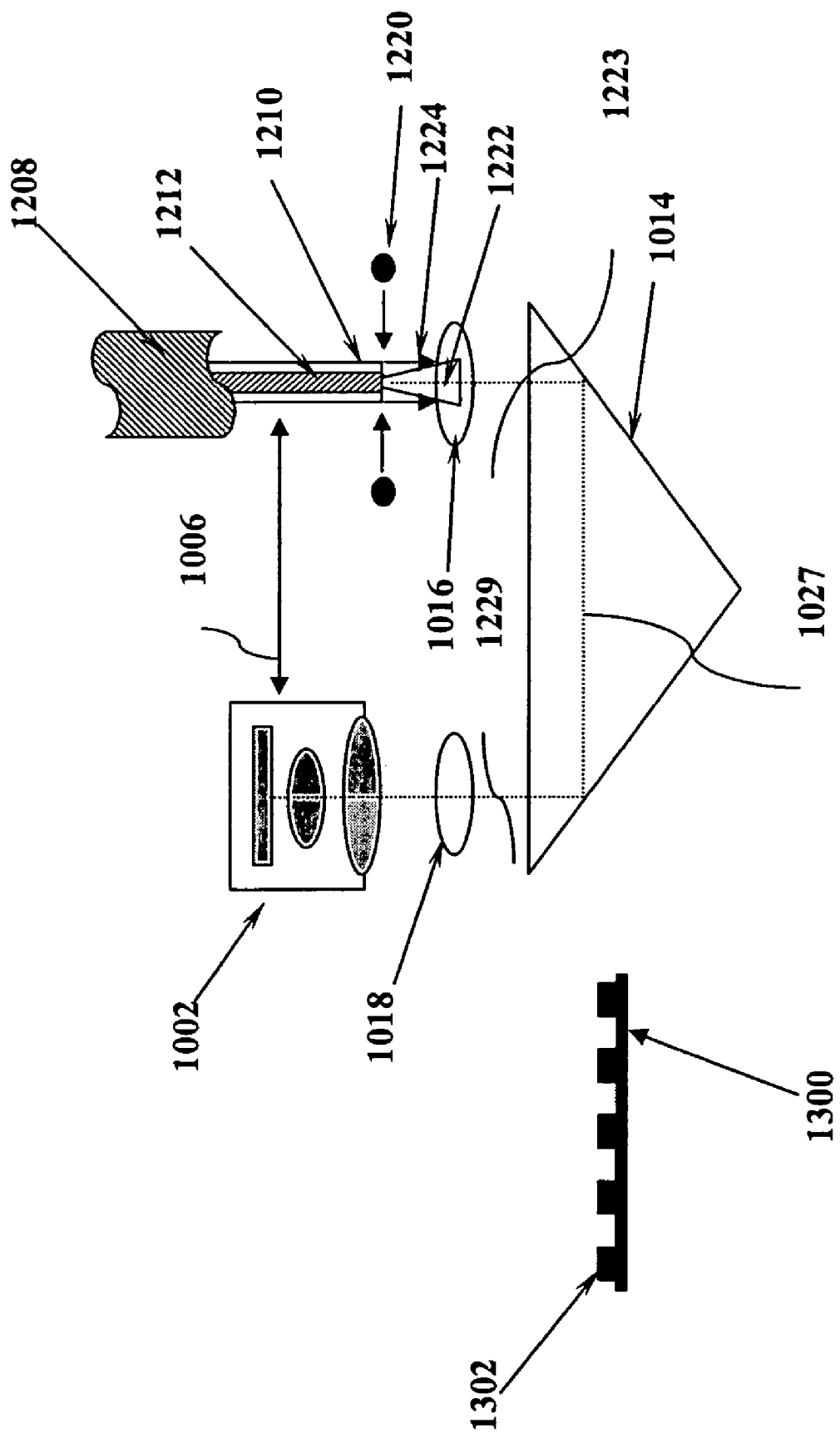
FIGS. 13A-13D are various views of a sixth exemplary embodiment of the present invention.

FIGS. 13A-13D illustrate a further embodiment of the present invention. In this exemplary embodiment, a cornercube offset alignment tool is used to improve the accuracy of alignment of an optical fiber 1208 with a circuit element, such as a detector 1302. In FIG. 13A, exemplary detector 1302 is part of an array 1300, although the invention is not so limited. It is also contemplated that detector 1302 may be a diode, such as a photodiode or an emitter of optical radiation. As in the previous exemplary embodiments, the use of a cornercube offset alignment tool allows for the use of a single optical detector instead of the conventional multiple detector systems.

Referring to FIG. 13A, the exemplary embodiment includes cornercube 1014, lenses 1016, 1018, dark field illumination system 1220 (which is well known to those practicing the art) to illuminate the fiber cladding edge 1210 of fiber core 1212 (which in turn produces reflections 1024 to outline cladding edge 1010), and optical detector 1002. In this exemplary embodiment, downward facing fiber 1208 is viewed by downward looking optical detector 1002, such as a camera (e.g., a substrate camera). Downward looking optical detector 1002 detects the emission of light 1222 from fiber core 1212 and is then able to determine the proper offset 1027 between the optical fiber centerline 1223 and central ray 1229 of downward looking optical detector 1002. As is further shown in FIG. 13A, downward facing fiber 1208 and optical detector 1002 are offset from one another by predetermined distance 1006.

Figure 13B:
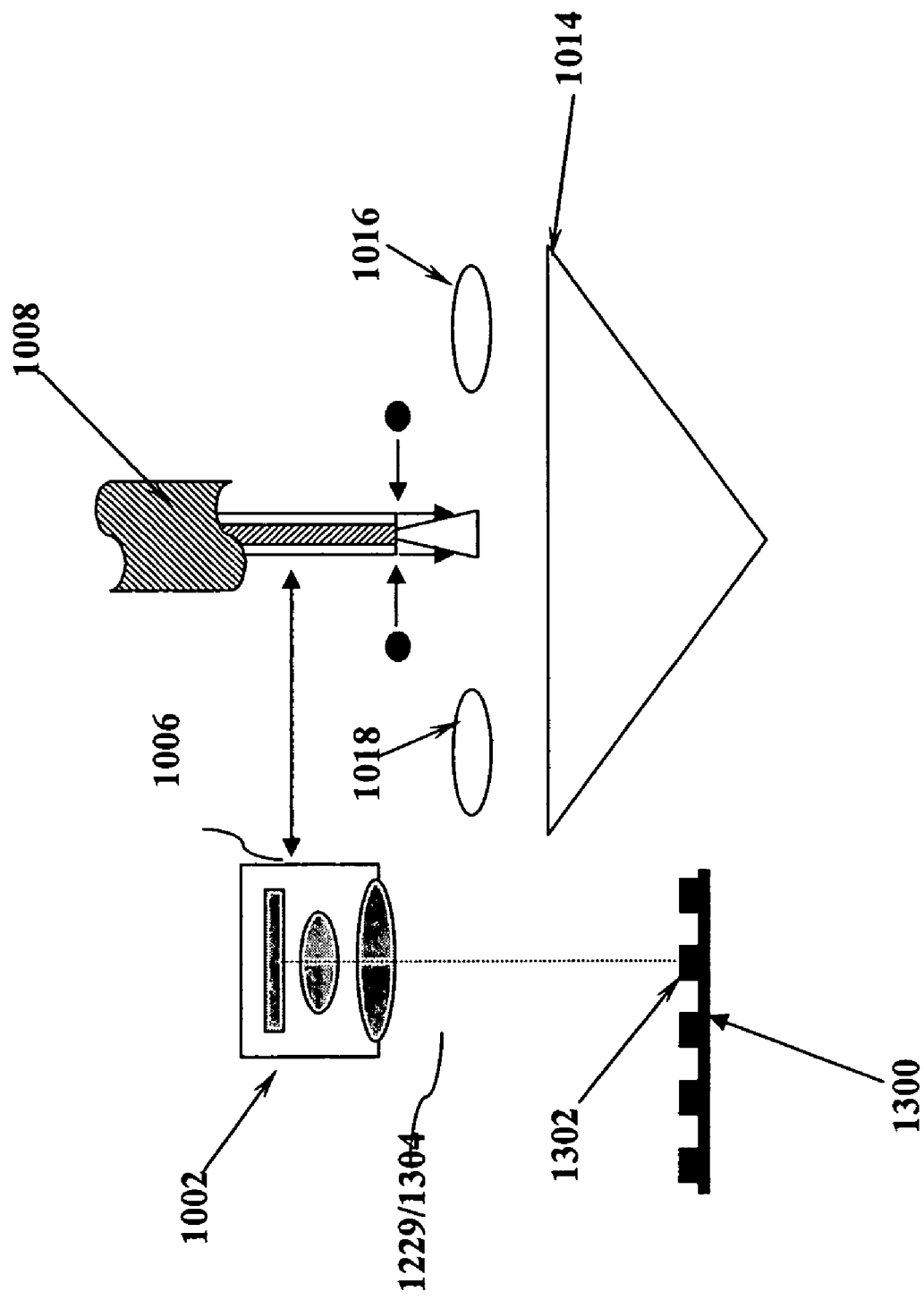

In FIG. 13B, downward looking optical detector 1002 and downward facing fiber 1208 are then repositioned such that central ray 1229 of downward looking optical detector 1002 is aligned with optical centerline 1304 of detector 1302. It is understood that optical centerline 1304, may not necessarily coincide with the physical center of detector 1302, but rather is dependent on the layout of the particular detector 1302. In this case the determination of optical centerline 1304 may be accomplished by the location of the center of the active sensing area of the detector.

Figure 13C:
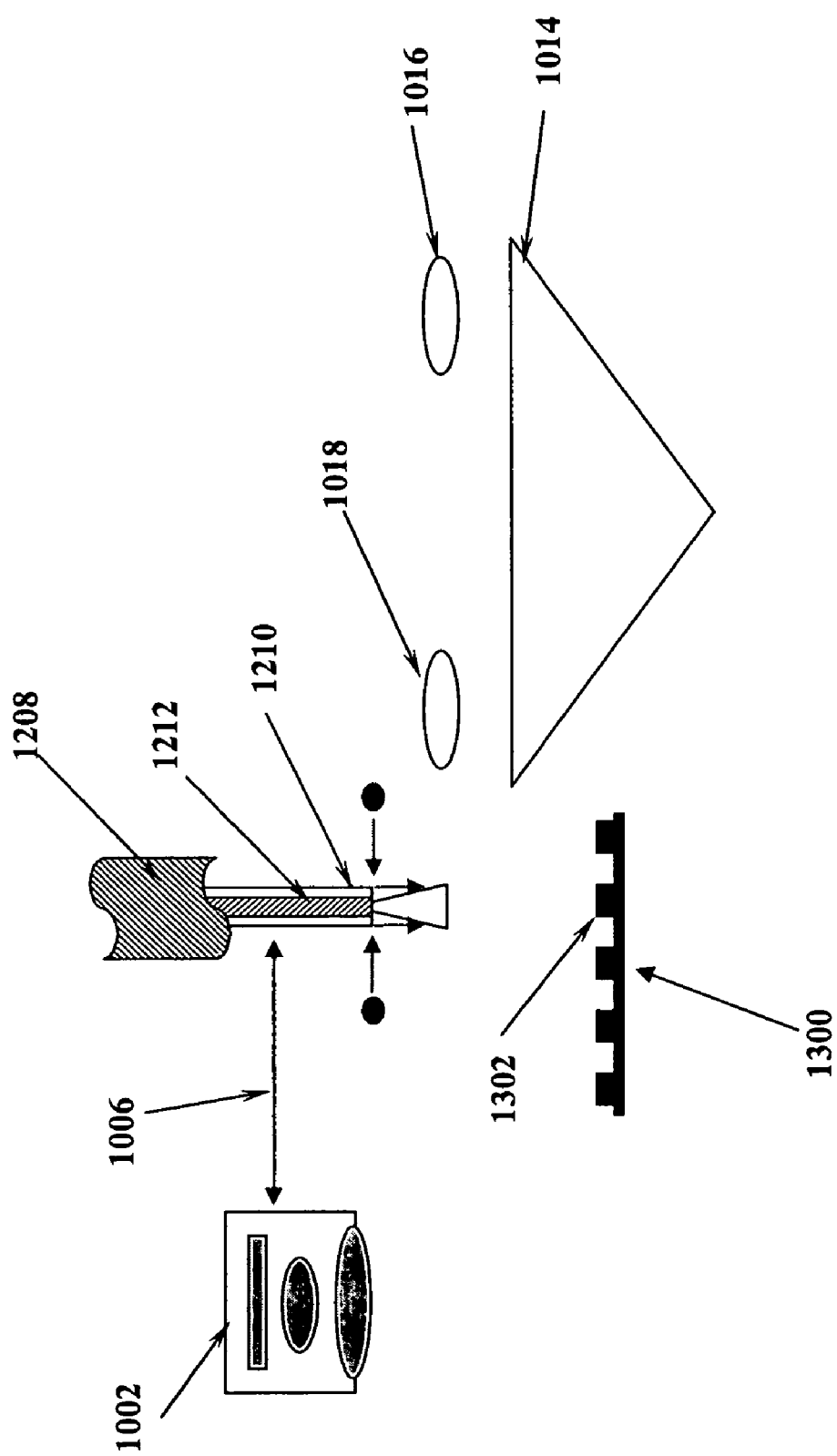
Figure 13D:
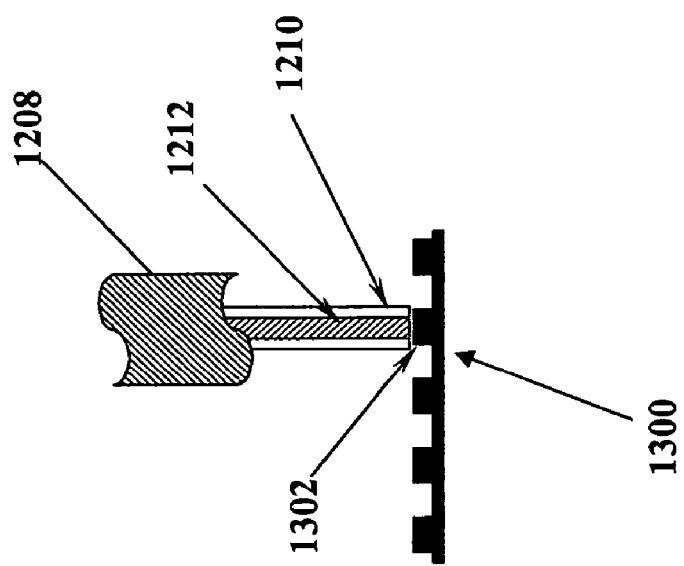

Next, and as shown in FIG. 13C, optical detector 1002 and downward facing fiber 1208 are again repositioned based on the offset 1027 determined during the process discussed above with respect to FIG. 13A (offset 1027 is illustrated in FIG. 13A). As a result, downward facing fiber 1208 and detector 1302 are aligned with one another. As shown in FIG. 13D, optical fiber 1208 and detector 1302 are then kept in aligned position using conventional techniques, such as optical epoxies, UV epoxies, for example.

Although the present invention has primarily been illustrated and described with respect to a cornercube device (e.g., a cornercube prism) it is not limited thereto. Other prism devices may be used, particularly other reflective prisms. In certain configurations of the present invention, it is desirable to have parallel image rays. In such a configuration, a reflective prism such as a cornercube prism may provide a beam which enters and exits the prism substantially parallel to one another; however, in certain configurations non-parallel beams/image rays may be desired, and other types of prisms may be utilized.

Although the present invention has primarily been described in relation to apparatuses and methods for measuring the size of a free air ball, it is not limited thereto. The apparatuses and methods disclosed herein are useful for measuring a shape of a free air ball, a texture of a free air ball, and any other quality of a free air ball that may be determined using the disclosed techniques. For example, such shapes and textures of free air balls may be compared to a threshold shape or texture to further control the free air ball formation process (e.g., a closed loop process).

Although the invention has been described with reference to exemplary embodiments, it is not limited thereto. Rather, the appended claims should be construed to include other variants and embodiments of the invention, which may be made by those skilled in the art without departing from the true spirit and scope of the present invention.

What is claimed:

1. A system for measuring the size of free air balls for use with a wire bonder having a wire bonding tool and an Electric Flame Off (EFO) device, the system comprising: an imager disposed above a first image plane; a prism disposed below the imager; and at least one lens positioned between the first image plane and the prism in a first optical path, the at least one lens positioned between the prism and the imager and in a second optical path, the second optical path being different from the first optical path, wherein an image of a free air ball disposed at a lower portion of the wire bonding tool is provided to the imager via the prism and the at least one lens, the imager being positioned at a height above a height of the free air ball, the prism being positioned at a height below the height of the free air ball, and the at least one lens being positioned at a height between the height of the free air ball and the height of the prism.

2. The system of claim 1 wherein the prism is a cornercube prism.

3. The system of claim 1 wherein the at least one lens includes a first lens and a second lens, the first lens being positioned between the first image plane and the prism in the first optical path, and the second lens being positioned between the prism and the imager in the second optical path.

4. The system of claim 1 wherein the first optical path and the second optical path are substantially parallel to one another.

5. The system according to claim 1, further comprising a processor in communication with the imager, the processor determining a size of the free air ball and providing at least one control signal to the EFO device to control the size of subsequent free air balls.

6. The system of claim 1, further comprising a plurality of magnification levels.

7. The system of claim 1, further comprising an illuminator disposed adjacent the lower portion of the wire bonding tool.

* * * * *